United States Patent
Tsutsumi et al.

(10) Patent No.: US 7,135,367 B2
(45) Date of Patent: Nov. 14, 2006

(54) MANUFACTURING METHOD OF SEMICONDUCTOR DEVICE

(75) Inventors: Tomohiko Tsutsumi, Kawasaki (JP); Taiji Ema, Kawasaki (JP); Hideyuki Kojima, Kawasaki (JP); Toru Anezaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/139,651

(22) Filed: May 31, 2005

(65) Prior Publication Data

US 2006/0177978 A1 Aug. 10, 2006

(30) Foreign Application Priority Data

Feb. 4, 2005 (JP) .............................. 2005-029492

(51) Int. Cl.
H01L 21/8234 (2006.01)
H01L 21/8244 (2006.01)
H01L 21/20 (2006.01)

(52) U.S. Cl. ................ 438/238; 438/239; 438/382; 438/383; 438/384; 438/385; 438/257; 438/258; 438/47; 438/174; 257/148; 257/153; 257/E21.004

(58) Field of Classification Search ........ 438/238–239, 438/382–385, 257–258, 45, 174; 257/304, 257/306

See application file for complete search history.

(56) References Cited

U.S. PATENT DOCUMENTS 6,130,139 A * 10/2000 Ukeda et al. ............... 438/424
6,693,002 B1 * 2/2004 Nakamura et al. .......... 438/238

OTHER PUBLICATIONS

Patent Abstract of Japan, Publication No. 2003158196 A, published on May 30, 2003.*
Patent Abstract of Japan, Publication No. 10150154 A, published on Jun. 2, 1998.*

* cited by examiner

*Primary Examiner*—Michael Lebentritt
*Assistant Examiner*—Mohsen Ahmadi
(74) *Attorney, Agent, or Firm*—Westerman, Hattori, Daniels & Adrian, LLP.

(57) ABSTRACT

A silicon oxide film as an insulating film is accumulated so as to cover a whole surface of a silicon substrate including a surface of a resistance element by, for example, a thermal CVD method, just after a resist pattern is removed. This silicon oxide film is processed to form a silicide block on the resistance element, and side wall spacers at both side surfaces of gate electrodes, and so on, of respective transistors, at the same time.

12 Claims, 25 Drawing Sheets

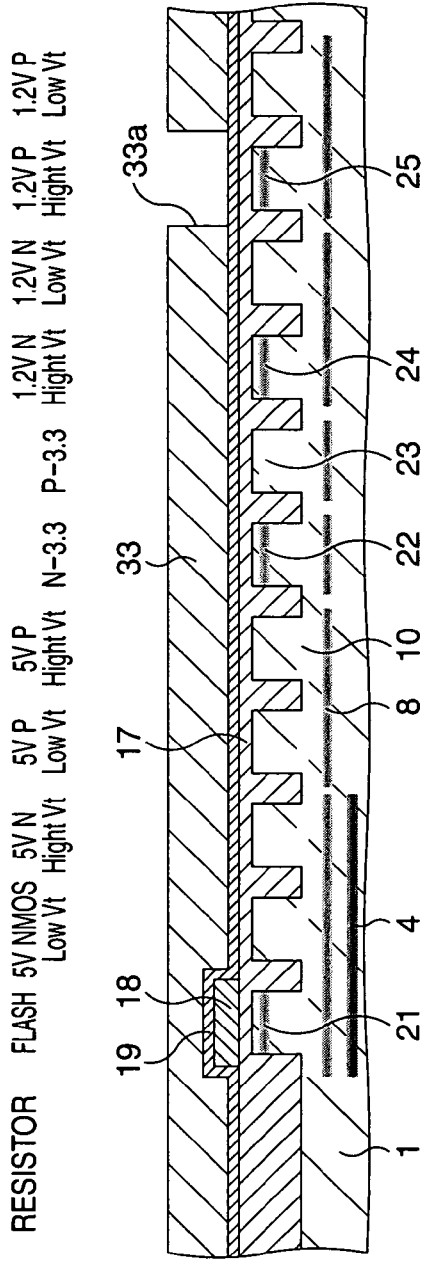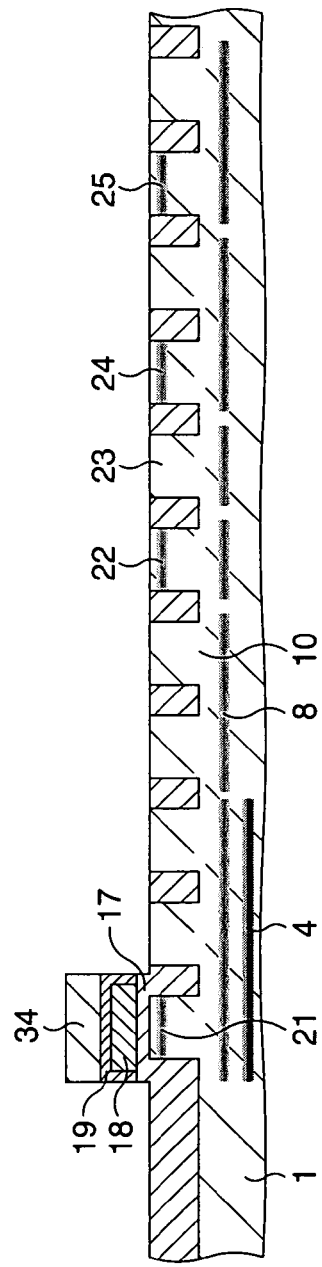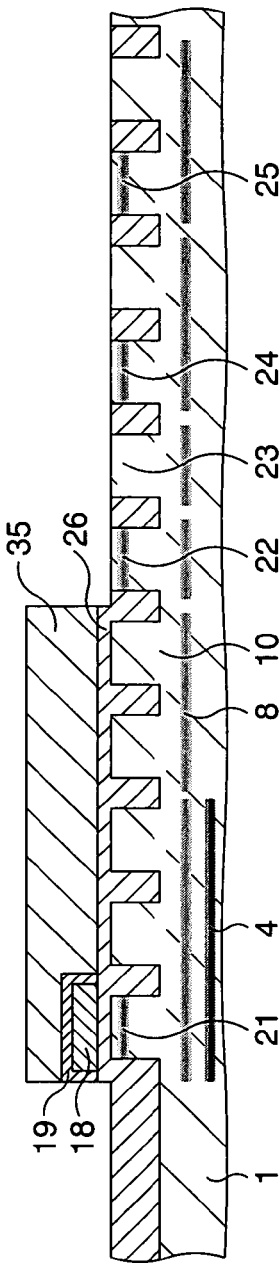
FIG. 6A
FIG. 6B
FIG. 6C

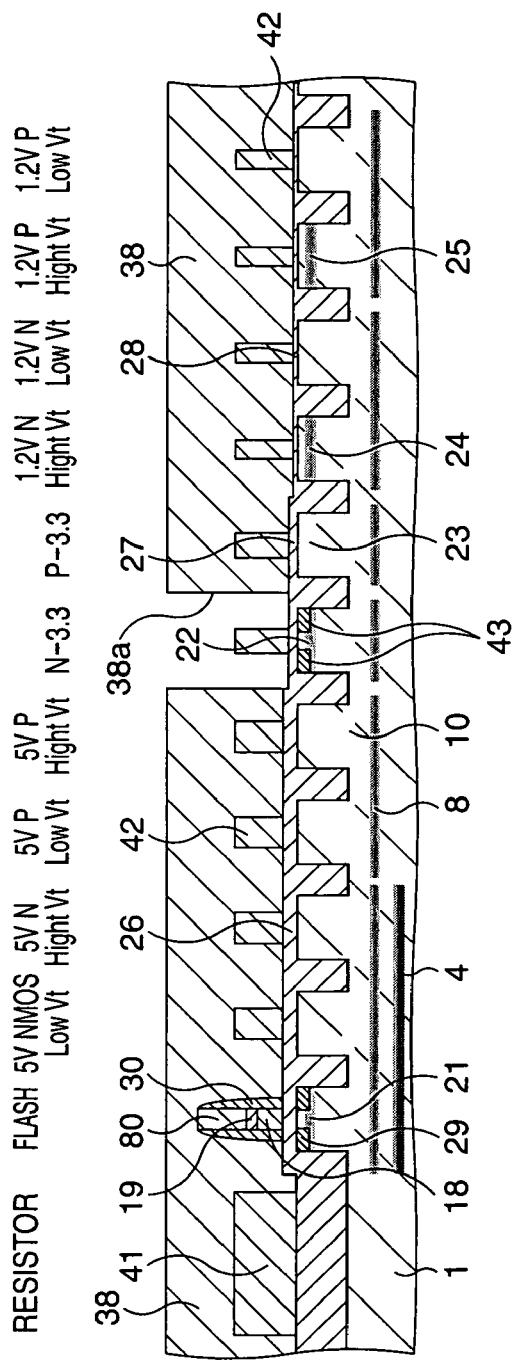
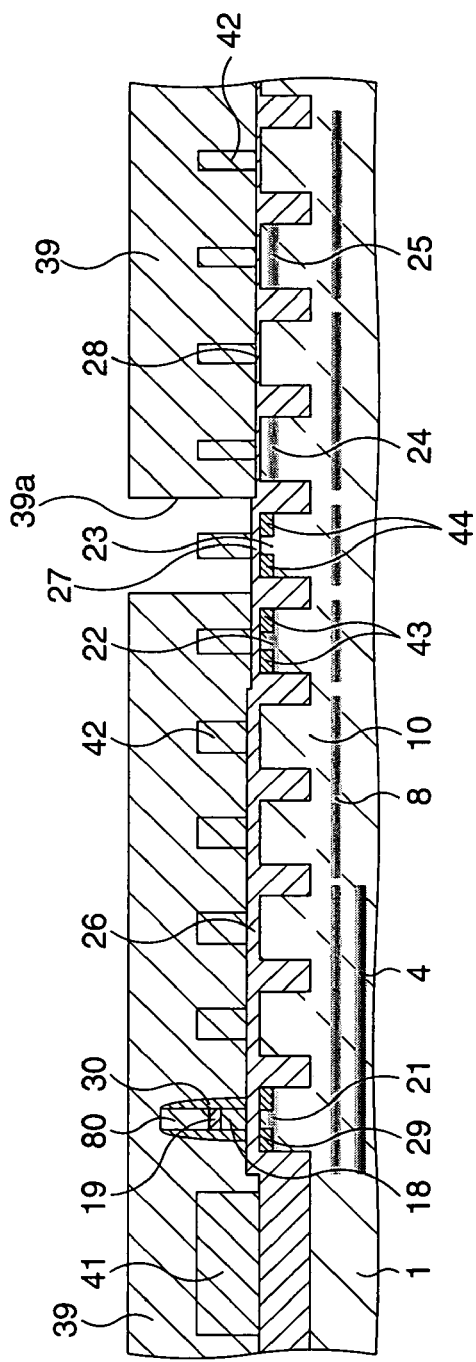
FIG. 9A
FIG. 9B

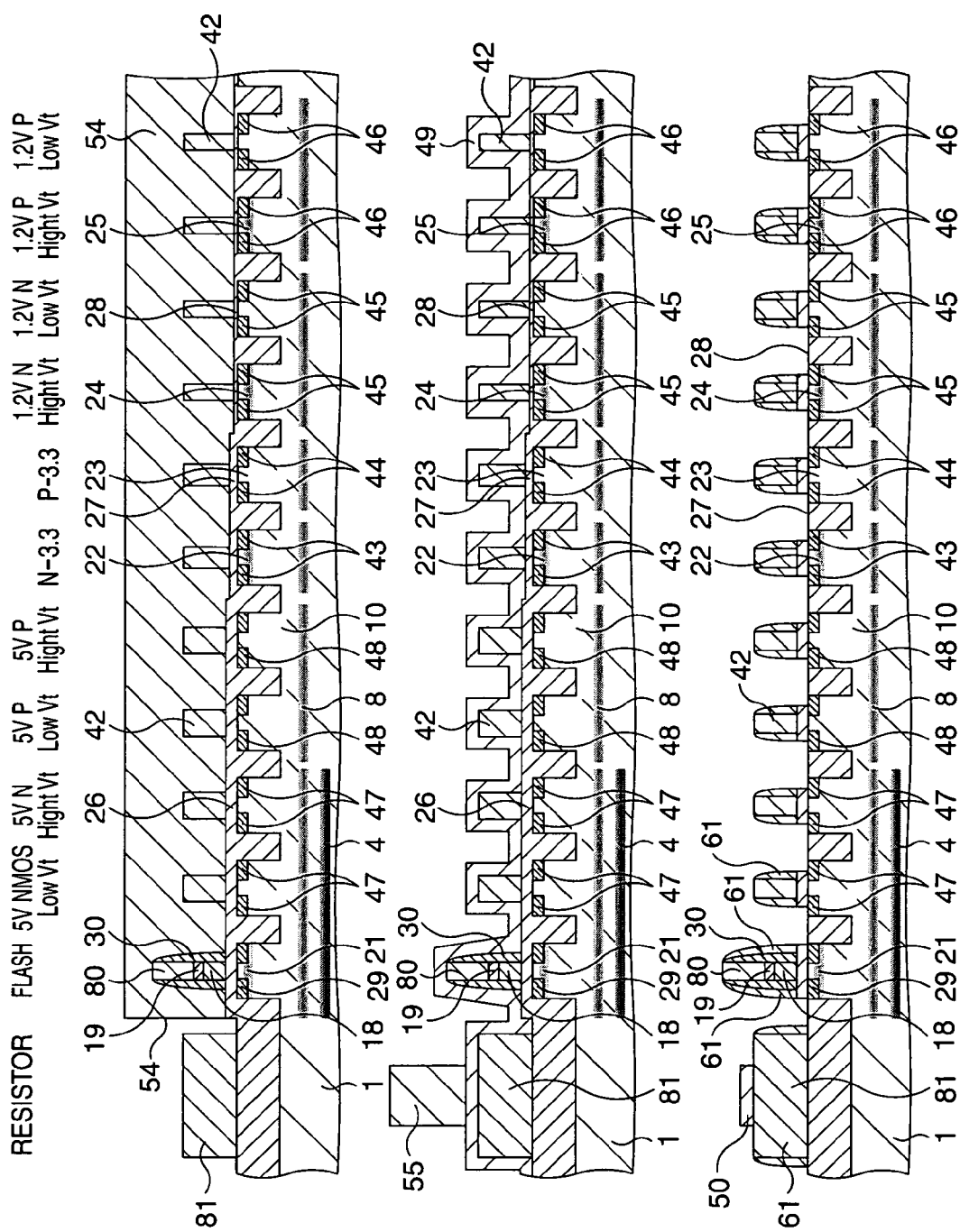

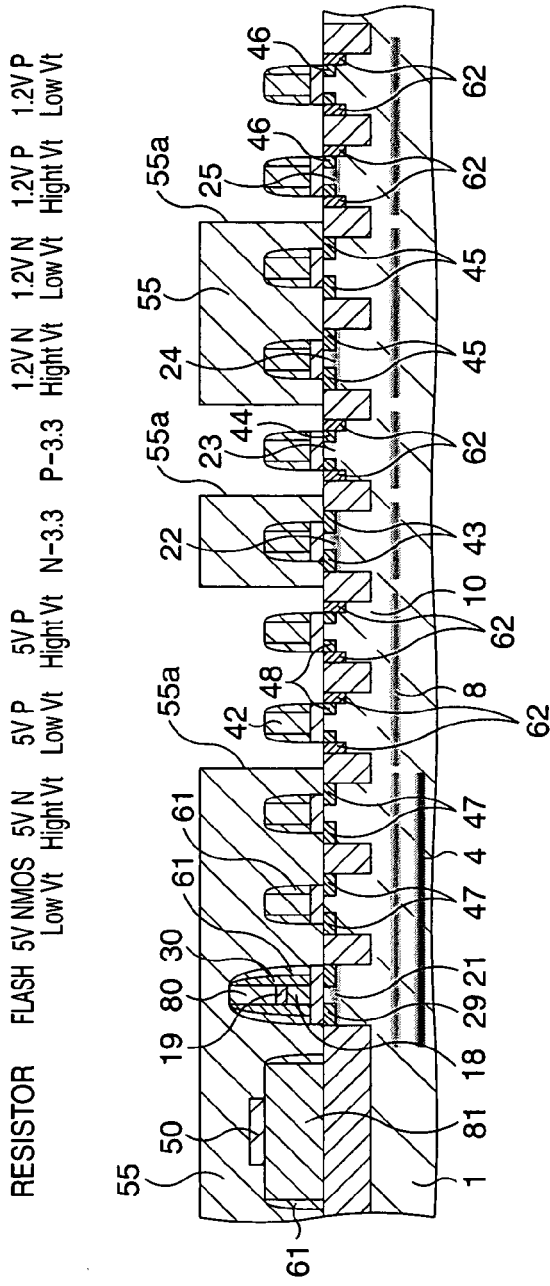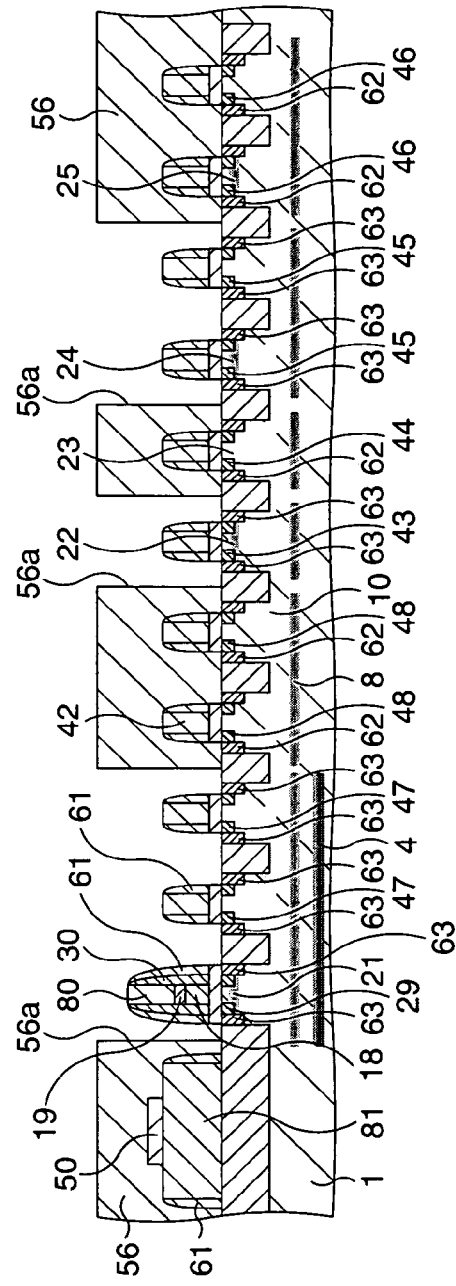
FIG. 13A
FIG. 13B

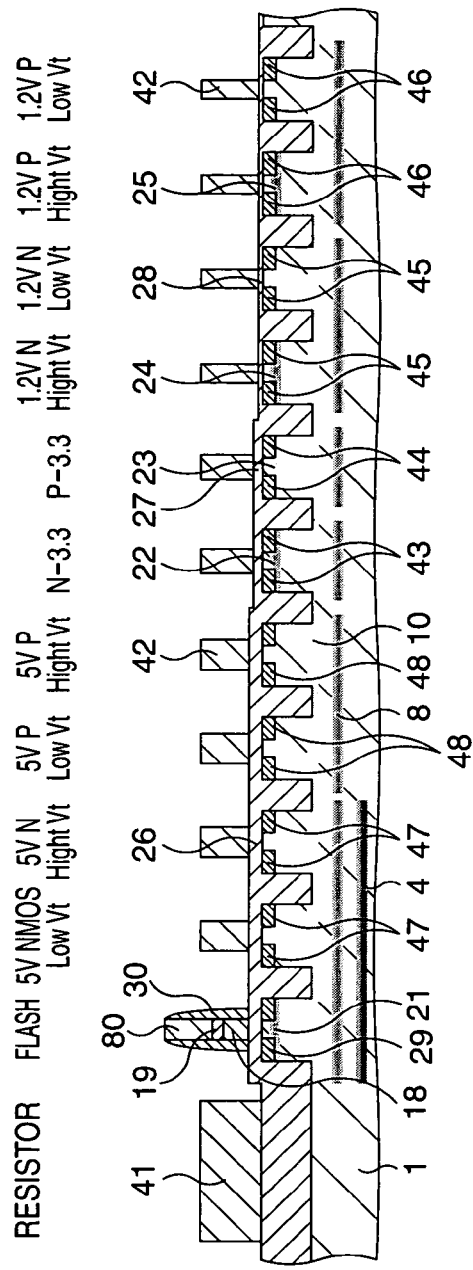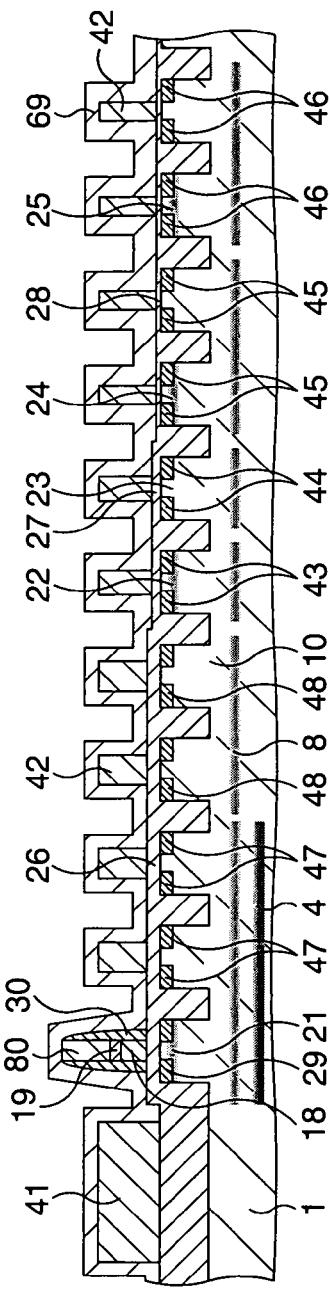
FIG. 15A
FIG. 15B

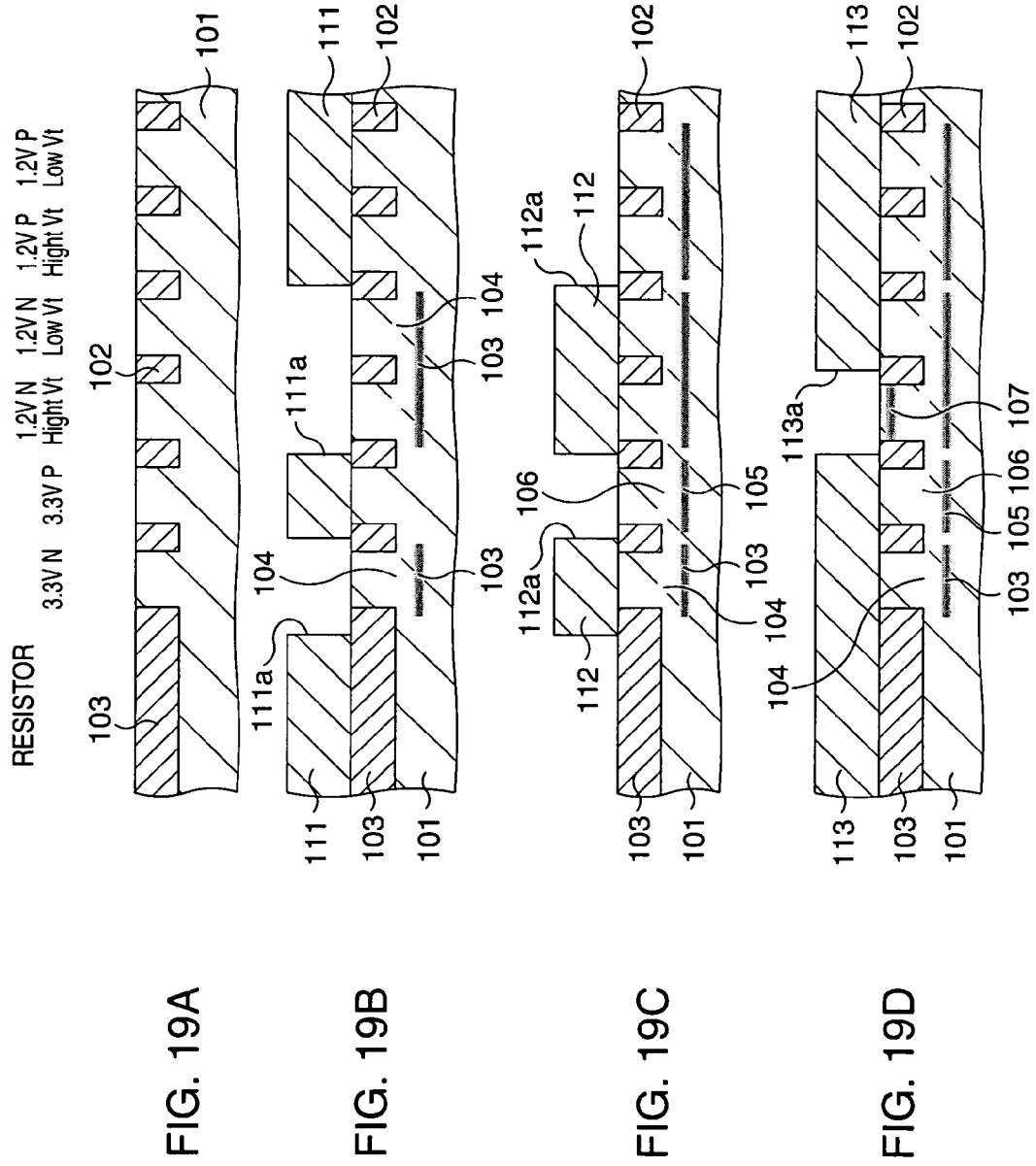

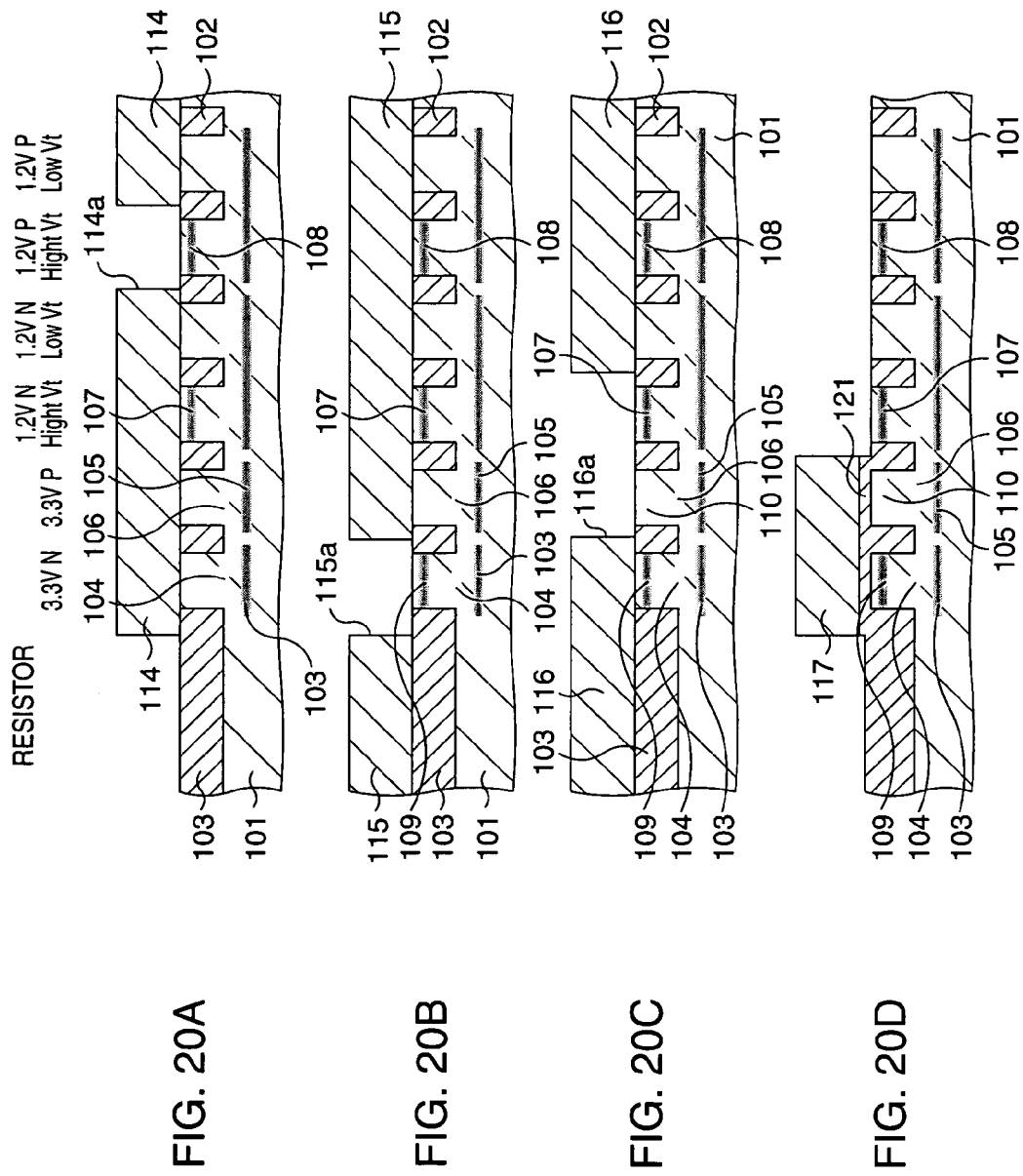

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2005-029492, filed on Feb. 4, 2005, the entire contents of which are incorporated herein by reference.

BACKGROUND OF THE INVENTION

1. Field of the Invention

The present invention relates to a manufacturing method of a semiconductor device having a resistance element composed of a semiconductor material.

2. Description of the Related Art

There is a resistance element having a resistor composed of a polycrystalline silicon, and so on, as one of an analog element in a semiconductor device. This resistance element is required to be adjusted with high precision to a desired resistance value, and therefore, a manufacturing method in which the resistance element whose resistance value is stably defined to the desired value can be obtained, is requested.

As the resistance element whose resistance value is stably defined to the desired value, there are ones described in the Patent Documents 1 and 2. In the Patent Documents 1 and 2, there are disclosed arts in which the resistance value at an electrical connecting portion on a surface of a resistor is eliminated to control the resistance value to be the desired value, and therefore, a silicide layer is formed at the corresponding connecting portion. Here, in the Patent Document 1, there is described a mode to form a gate electrode, and so on, of a transistor after forming the resistor, and in the Patent Document 2, there is described a mode to prevent a complication of processes by forming the resistor and the gate electrode at the same time.

[Patent Document 1] Japanese Patent Application Laid-open No. 2003-158196

[Patent Document 2] Japanese Patent Application Laid-open No. Hei 10-150154

As is described in the above-stated Patent Documents 1 and 2, it is possible to reduce a connection resistive component among the whole resistance value of the resistance element to improve a controllability by making the electrical connecting portion of the surface of the resistance element silicide. However, in recent years when a requirement for further miniaturization and high performance of a semiconductor device including a resistance element is increasing, it is necessary to precisely control the resistance values of not only the connection resistive component but also the resistance element main body.

SUMMARY OF THE INVENTION

The present invention is made in consideration of the above problems, and an object thereof is to provide a manufacturing method of a semiconductor device in which the semiconductor device including a resistance element with high reliability is realized by stably controlling resistance values of not only a connection resistive component but also the resistance element main body easily and precisely, without increasing the number of processes, as for the resistance value of the resistance element.

A manufacturing method of a semiconductor device in which a first and a second element isolation structures are formed on a semiconductor substrate, and transistors are included at active regions defined by the first element isolation structure, and a resistance element is included on the second element isolation structure, including the steps of: forming a semiconductor film on the semiconductor substrate including on the second element isolation structure, and processing the semiconductor film so that the semiconductor film is respectively left on the second element isolation structure and on the active regions to form a resistor and gate electrodes; forming a first mask exposing the active regions, doping a first impurity into both sides of the gate electrodes at the active regions, and thereafter, removing the first mask; forming a second mask exposing the resistor, doping a second impurity into the resistor, and thereafter, removing the second mask; forming an insulating film on a whole surface including the resistor and the gate electrodes, just after the second mask is removed; and processing the insulating film to leave the insulating film so as to cover a part of an upper surface of the resistor, and to cover side surfaces of the gate electrodes.

Another mode of a manufacturing method of a semiconductor device in which a first and a second element isolation structures are formed on a semiconductor substrate, and transistors are included at active regions defined by the first element isolation structure, and a resistance element is included on the second element isolation structure, including the steps of: forming a semiconductor film on the semiconductor substrate including on the second element isolation structure, and processing the semiconductor film so that the semiconductor film is left on the second element isolation structure to form a resistor; forming a mask exposing the resistor, doping an impurity into the resistor by using the mask, and thereafter, removing the mask; forming an insulating film so as to cover the resistor just after the mask is removed; and processing the insulating film to leave the insulating film in a shape covering a part of an upper surface of the resistor, when the resistance element is formed.

BRIEF DESCRIPTION OF THE DRAWINGS

FIG. 6A, FIG. 6B, and FIG. 6C are schematic sectional views showing the manufacturing method of the semiconductor device according to the first embodiment in process sequence following to FIG. 5C;

FIG. 9A and FIG. 9B are schematic sectional views showing the manufacturing method of the semiconductor device according to the first embodiment in process sequence following to FIG. 8C;

FIG. 12A, FIG. 12B, and FIG. 12C are schematic sectional views showing the manufacturing method of the semiconductor device according to the first embodiment in process sequence following to FIG. 11B;

FIG. 13A and FIG. 13B are schematic sectional views showing the manufacturing method of the semiconductor device according to the first embodiment in process sequence following to FIG. 12C;

FIG. 15A and FIG. 15B are schematic sectional views showing a manufacturing method of a semiconductor device according to a modification example of the first embodiment in process sequence;

FIG. 19A, FIG. 19B, FIG. 19C, and FIG. 19D are schematic sectional views showing a manufacturing method of a semiconductor device according to a second embodiment in process sequence;

FIG. 20A, FIG. 20B, FIG. 20C, and FIG. 20D are schematic sectional views showing the manufacturing method of the semiconductor device according to the second embodiment in process sequence following to FIG. 19D;

DETAILED DESCRIPTION OF THE PREFERRED EMBODIMENTS

—Basic Gist of the Present Invention—

The present inventor focuses on a sequence, and so on, of essential processes centering on an impurity doping process into a resistor so as to stably control resistance values of not only a connection resistive component but also a resistance element main body easily and precisely, without increasing the number of processes, as for the resistance value of the resistance element.

Figure 1:
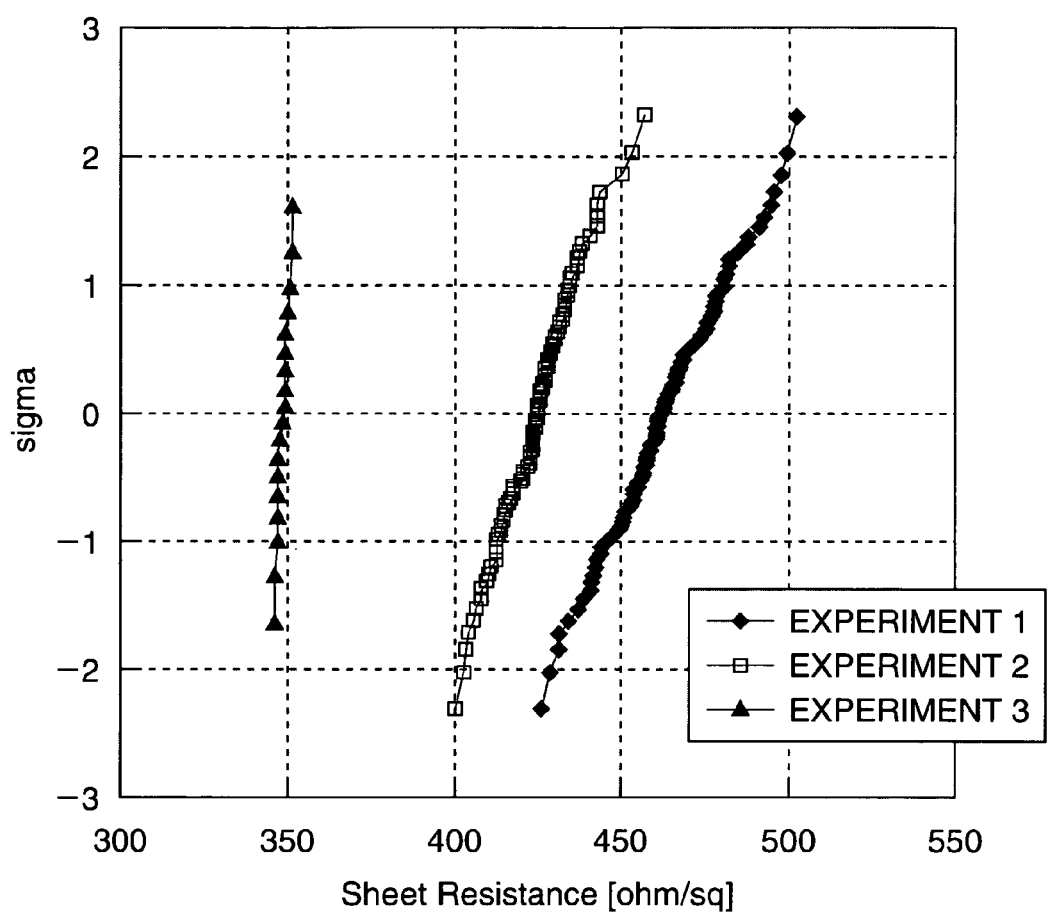
FIG. 1 is a characteristic chart showing probability plots of resistance values investigated by the present inventor as for resistance elements formed by different manufacturing processes.

FIG. 1 is a characteristic chart showing probability plots of resistance values investigated by the present inventor as for resistance elements formed by different manufacturing processes. Here, a horizontal axis represents a sheet resistance value ($\Omega$/sq) and a vertical axis represents a (sigma), respectively.

In FIG. 1, in an experiment 1, processes are performed in the following sequence, (1) a process of impurity doping into a resistor (including a lithography using a resist and a peeling of the resist), (2) a process of twice impurity dopings into active regions of transistors, (3) a process of a heat treatment to activate the doped impurities, (4) a process of forming an insulating film (to be a silicide block layer) covering the resistor.

In an experiment 2, the processes are performed in the following sequence, (1) the process of impurity doping into the resistor (including the lithography using the resist and the peeling of the resist), (2) the process of the heat treatment to activate the doped impurities just after (1), (3) the process of forming the insulating film (to be a silicide block layer) covering the resistor.

In an experiment 3, the processes are performed in the following sequence, (1) the process of impurity doping into the resistor (including the lithography using the resist and the peeling of the resist), (2) the process of forming an insulating film (to be the silicide block layer) covering the resistor just after (1), (3) the process of the heat treatment to activate the doped impurities.

As it is obvious from FIG. 1, a dispersion of the resistance value in the experiment 1 is the largest, and the dispersion of the resistance value in the experiment 3 is the smallest. In the experiment 3, a uniformity of the resistance value is remarkable, the dispersion of the resistance value is seldom seen and the resistance value is precisely controlled within a desired value.

To obtain a resistance element having a stable resistance value without increasing the number of processes, the present inventor considers that it is required (A) to perform the process sequence of the experiment 3, and (B) to reduce operations (and the time for the operation) during the period from an impurity doping into the resistor to a forming of an insulating film of a silicide block layer as much as possible, from this result of the experiments. To satisfy the latter condition (B), as a premise thereof, it is required not to perform the impurity doping in a state that a semiconductor film formed on a whole surface (for example, a polycrystalline silicon film), but to perform the impurity doping after the semiconductor film is processed into the resistor. Forming of a mask (such as a resist) for impurity doping into a resistor is indispensable because the resistance element and a transistor (actually plural transistors having different doped impurities) are formed on the same substrate, and therefore, a requisite minimum operation in this case is to remove the corresponding mask. Namely, to satisfy the condition (B), at first the resistor is pattern formed from the semiconductor film, the impurity is doped into this resistor by using the mask, and the insulating film to be the silicide block layer is to be formed just after the corresponding mask is removed.

In this respect, in the above-stated both Patent Documents 1 and 2, there are no description or suggestion concerning the respective conditions like the one stated in the present invention. Namely, in the Patent Document 1, "a step forming a resistance element by ion implanting into a semiconductor material, and a step forming an interlayer film on the resistance element" are cited in claim 7 thereof, but in the description, it is clearly specified that an impurity is ion implanted into a polysilicon, and thereafter, the resistance element is formed by processing this polysilicon, and thereafter, the interlayer film is formed by going through the formation, and so on, of a gate insulating film and a thin oxide film. Besides, in the Patent Document 2, "a step forming a resistor by patterning a polycrystalline silicon film, and a step forming an insulating film" are cited in claim 1 thereof, but in the description, there is no concrete description about the ion implanting into the polycrystalline silicon film from a front side, and when the resistor and gate electrodes are to have different concentrations of the impurities, the polycrystalline silicon film is grown up, and thereafter, the mask is formed to separate the ion implanting. Namely, in both Patent Documents 1 and 2, the impurity is doped in a state that the polycrystalline silicon film is grown up to the whole substrate, and thereafter, the polycrystalline silicon film is processed to pattern form the resistor.

On the contrary, the present invention can reach the consideration that the condition of the most appropriate process sequence (A), and the condition to reduce the operations between the impurity doping into the resistor and the formation of the insulating film as much as possible (B), through a prospect thinking of precise experiments with changing the process sequences such as the above-stated experiments (1) to (3). Therefore, the present invention is a discrete invention from the Patent Documents 1 and 2 which are entirely indifferent from the above-stated terms and conditions without going through such prospects.

Besides, in the present invention, the above-stated conditions (A) and (B) are performed by forming the resistor and the gate electrodes of the transistors at the same time from the same semiconductor film, to stably control the resistance values of not only the connection resistive component but also the resistance element main body easily and precisely, premising not to increase the number of processes. In this case, the resistor and the gate electrodes are formed at the same time by processing the semiconductor film, and thereafter, at first, the gate electrodes are used as masks to form LDD regions by doping an impurity into active regions, and next, the impurity is doped into the resistor. Then, the insulating film is formed just after the mask is removed, the insulating film is processed, the silicide block layer is formed by leaving the insulating film on the resistor, and side wall spacers are formed by leaving the insulating film at side walls of the gate electrodes.

Concrete Embodiments Applying the Present Invention

Hereinafter, concrete embodiments applying the present invention are described in detail with reference to drawings.

First Embodiment

A semiconductor device manufactured by the present invention is configured by integrating a resistance element and, for example, 11 varieties of transistors. Here, as the respective transistors, there are a so called flash memory being a nonvolatile memory, an N-channel high voltage (5 V)-low threshold transistor (5VN·LowVt), an N-channel high voltage (5 V)·high threshold transistor (5VN·HighVt), a P-channel high voltage (5 V)·low threshold transistor (5VP·LowVt), a P-channel high voltage (5 V)·high threshold transistor (5VN·HighVt) an N-channel middle voltage (3.3 V) (N-3.3), a P-channel middle voltage (3.3 V) (P-3.3), an N-channel low voltage (1.2 V)·high threshold transistor (1.2VN·HighVt), an N-channel low voltage (1.2 V)·low threshold transistor (1.2VN·LowVt), a P-channel low voltage (1.2 V)·high threshold transisgor (1.2VP·HighVt), and a P-channel low voltage (1.2 V)·low threshold transistor (1.2VP·LowVt).

The flash memory constitutes a high voltage flash memory control circuit, and, for example, it is a transistor operates at 5 V.

The low voltage transistors (low threshold: 1.2VN·LowVt, 1.2VP·LowVt, high threshold: 1.2VN·HighVt, 1.2VP·HighVt) constitute a logic circuit component, and they are, for example, transistors operating at 1.2 V. For these transistors, ultrathin gate insulating films are used for an improvement of a performance of the logic circuit component.

The middle voltage transistors constitute an input/output circuit component, and they are, for example, transistors operating at 2.5 V or at 3.3 V. Film thicknesses of gate insulating films control conditions of threshold voltages, forming conditions of LDD regions, and so on, are different between the transistors of 2.5 V operation and 3.3 V operation. However, it is not necessary to mount both transistors, but either one of them is to be mounted. In the present embodiment, it is explained that the transistors of 3.3 V operation (N-3.3, P-3.3) are to be mounted.

The high voltage transistors (low threshold: 5VN·LowVt, 5VP·LowVt, high threshold: 5VN·HighVt, 5VP·HighVt) are, for example, transistors operating at 5V.

FIG. 2A to FIG. 14B are schematic sectional views showing a manufacturing method of a semiconductor device according to a first embodiment in process sequence. In the respective views, a resistance element and 11 varieties of transistors (flash memory, 5VN·LowVt, 5VN·HighVt, 5VP·LowVt, 5VP·HighVt, N-3.3, P-3.3, 1.2VN·HighVt, 1.2VN·LowVt, 1.2VP·HighVt, and 1.2VP·LowVt) are formed from left side in sequence. Here, at upper portions of the respective views, a forming region of the resistance element and active regions of the respective transistors are shown.

At first, an element isolation structure is formed to define the forming region of the resistance element and the active regions of the respective transistors.

Figure 2A:
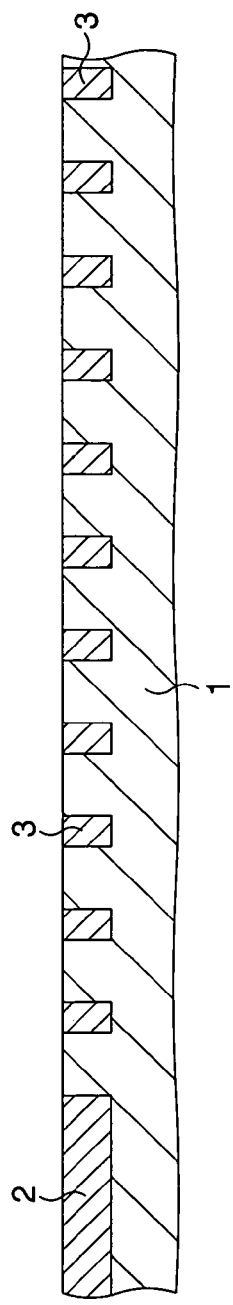
FIG. 2A, FIG. 2B, and FIG. 2C are schematic sectional views showing a manufacturing method of a semiconductor device according to a first embodiment in process sequence.

As shown in FIG. 2A, respective first STI regions 3 and a second STI region 2 as the element isolation structures are formed at an element isolation region of a silicon substrate 1, by using, for example, an STI (Shallow Trench Isolation) method at a surface layer of the silicon substrate 1. A field oxide film as the element isolation structure may be formed by a so-called LOCOS method instead of the STI. The respective active regions of the 11 varieties of transistors are defined by the respective first STI regions 3, and the forming region of the resistance element is defined by the second STI region 2. Next, surfaces of the respective active regions are oxidized to form a thin silicon oxide film (not shown) with a film thickness of approximately 10 nm.

Subsequently, the impurity is doped into the respective active regions of the flash memory, 5VN·LowVt, and 5VN·HighVt.

Figure 2B:
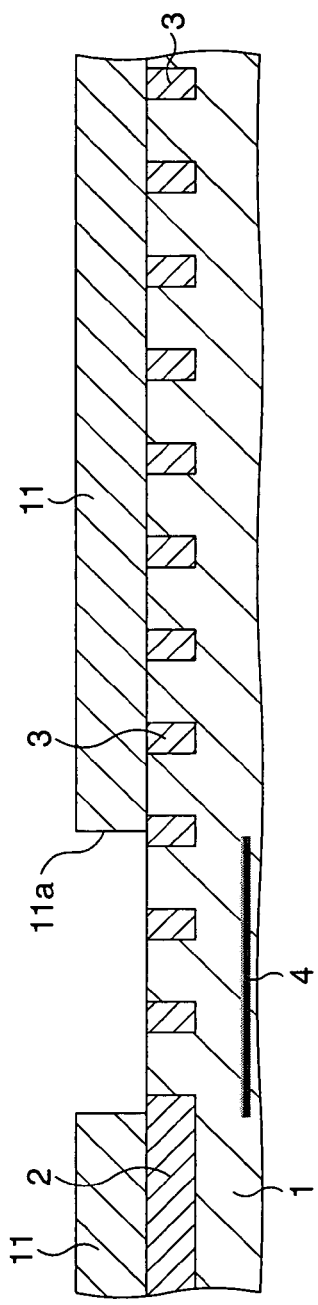

As shown in FIG. 2B, a resist is coated on the silicon substrate 1, the corresponding resist is processed by a lithography, and an opening 11a including the respective active regions of the flash memory, 5VN·LowVt, and 5VN·HighVt is formed to form a resist pattern 11. Next, this resist pattern 11 is used as a mask, and an N-type impurity, here phosphorus ($P^+$) is ion implanted into a deep portion of the respective active regions of the flash memory, 5VN·LowVt, and 5VN·HighVt, with a condition of an acceleration energy of 2 MeV, a dose amount of $2\times10^{13}/cm^2$. The implanted impurity is denoted by a doped impurity 4. The resist pattern 11 is then removed by an ashing treatment, and so on.

Subsequently, the impurity is doped into the respective active regions of the flash memory, 5VN·LowVt, 5VN·HighVt, N-3.3, 1.2VN·HighVt, and 1. 2VN·LowVt.

Figure 2C:
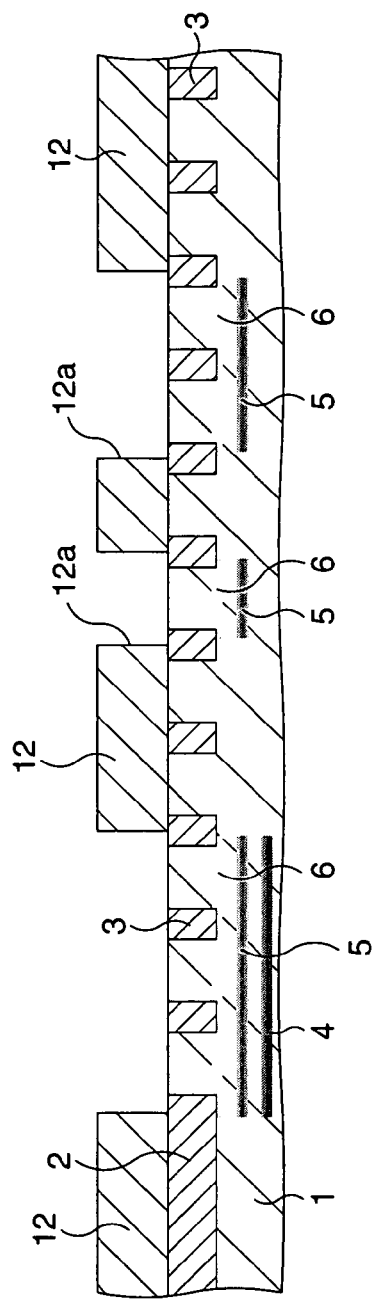

As shown in FIG. 2C, the resist is coated on the silicon substrate 1, the corresponding resist is processed by the lithography, and respective openings 12a including the respective active regions of the flash memory, 5VN·LowVt, and 5VN·HighVt, the active region of N-3.3, and the respective active regions of 1.2VN·HighVt, 1.2VN·LowVt, are formed to form a resist pattern 12. Next, this resist pattern 12 is used as the mask, and a P-type impurity to form a P-type well, here boron (B+) is ion implanted into the respective active regions of the flash memory, 5VN·LowVt, 5VN·HighVt, N-3.3, 1.2VN·Highvt, and 1.2VN·LowVt, with the condition of the acceleration energy of 400 keV, the dose amount of $1.4\times10^{13}/cm^2$. The implanted impurities are denoted by doped impurities 5. Further, this resist pattern 12 is used as the mask, and the P-type impurity to form channel stop regions, here boron ($B^+$) is ion implanted into the respective active regions of the flash memory, 5VN·LowVt, 5VN·HighVt, N-3.3, 1.2VN·HighVt, and 1.2VN·LowVt, with the condition of the acceleration energy of 100 keV, the dose amount of $3\times10^{12}/cm^2$. The implanted impurities are denoted by doped impurities 6. The resist pattern 12 is then removed by the ashing treatment, and so on.

Subsequently, the impurity is doped into the respective active regions of 5VN·HighVt, N-3.3, 1.2VN·Highvt, and 1.2VN·LowVt.

Figure 3A:
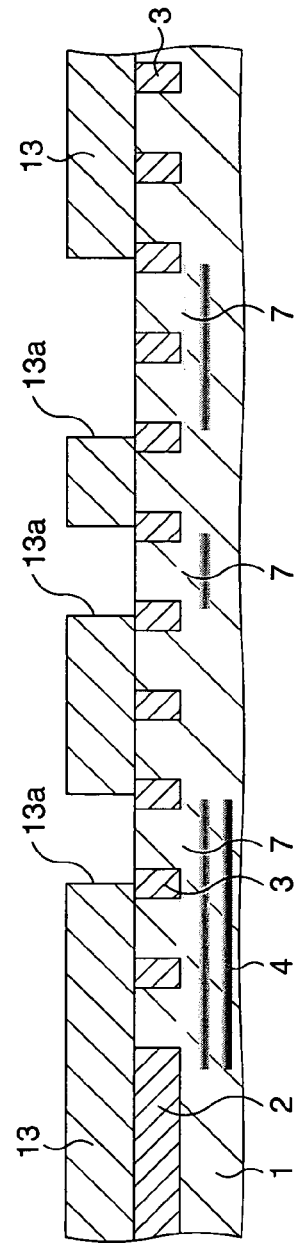
FIG. 3A, FIG. 3B, and FIG. 3C are schematic sectional views showing the manufacturing method of the semiconductor device according to the first embodiment in process sequence following to FIG. 2C.

As shown in FIG. 3A, the resist is coated on the silicon substrate 1, the corresponding resist is processed by the lithography, and respective openings 13a including the active region of 5VN·HighVt, the active region of N-3.3, and the respective active regions of 1.2VN·HighVt, 1.2VN·LowVt, are formed to form a resist pattern 13. Next, this resist pattern 13 is used as the mask, and the P-type impurity, here boron ($B^+$) is ion implanted into the respective active regions of 5VN·HighVt, N-3.3, 1.2VN·HighVt, and 1.2VN·LowVt, with the condition of the acceleration energy of 100 keV, the dose amount of $4\times10^{12}/cm^2$. This ion implantation is serving as both for a high threshold control of the N-channel high voltage transistor and for forming channel stop regions of the N-channel low voltage transistor. The implanted impurities are denoted by doped impurities 7. The resist pattern 13 is then removed by the ashing treatment, and so on.

Subsequently, the impurity is doped into the respective active regions of 5VP·LowVt, 5VP·HighVt, P-3.3, 1.2VP·HighVt, and 1.2VP·LowVt.

Figure 3B:
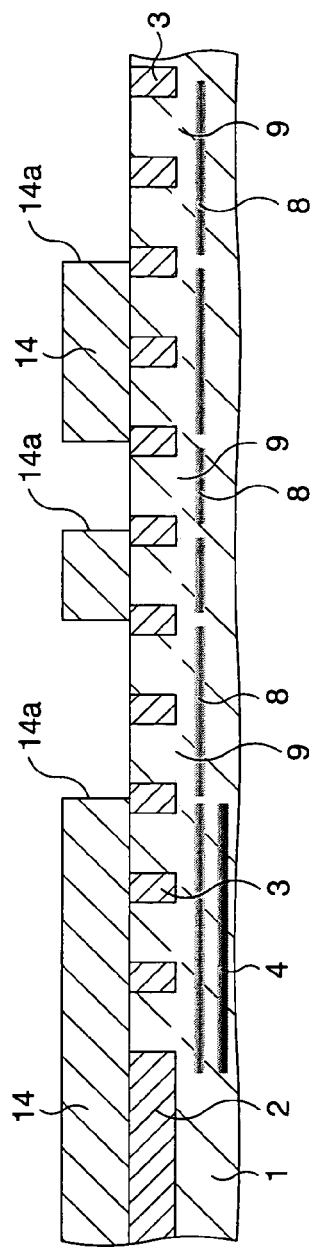

As shown in FIG. 3B, the resist is coated on the silicon substrate 1, the corresponding resist is processed by the lithography, and respective openings 14a including the respective active regions of 5VP·LowVt, 5VP·HighVt, the active region of P-3.3, and the respective active regions of 1.2VP·HighVt, 1.2VP·LowVt, are formed to form a resist pattern 14. Next, this resist pattern 14 is used as the mask, and the N-type impurity to form the N-type well, here phosphorus ($P^+$) is ion implanted into the respective active regions of 5VP·LowVt, 5VP·HighVt, P-3.3, 1.2VP·HighVt, and 1.2VP·LowVt, with the condition of the acceleration energy of 600 keV, the dose amount of $1.5\times10^{13}/cm^2$. The implanted impurities are denoted by doped impurities 8. Further, this resist pattern 14 is used as the mask, and the N-type impurity to form the channel stop region, here phosphorus ($P^+$) is ion implanted into the respective active regions of 5VP·LowVt, 5VP·HighVt, P-3.3, 1.2VP·HighVt, and 1.2VP·LowVt, with the condition of the acceleration energy of 240 keV, the dose amount of $9\times10^{11}/cm^2$. Incidentally, the latter ion implantation is for the threshold control of the P-channel high voltage low threshold transistor, and implantation conditions thereof can be adjusted properly. The implanted impurities are denoted by doped impurities 9. The resist pattern 14 is then removed by the ashing treatment, and so on.

Subsequently, the impurity is doped into the respective active regions of 5VP·HighVt, P-3.3, 1.2VP·HighVt, and 1.2VP·LowVt.

Figure 3C:
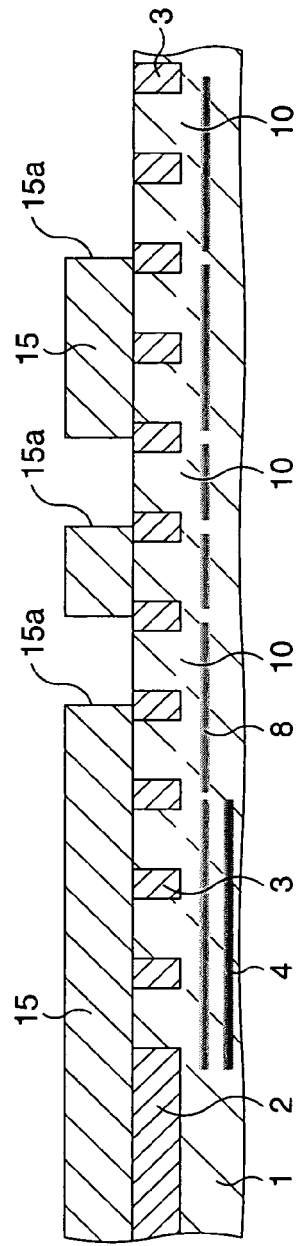

As shown in FIG. 3C, respective openings 15a including the active region of 5VP·HighVt, the active region of P-3.3, and the respective active regions of 1.2VP·HighVt, 1.2VP·LowVt, are formed to form a resist pattern 15. Next, this resist pattern 15 is used as the mask, and the N-type impurity, here phosphorus ($P^+$) is ion implanted into the respective active regions of 5VP·HighVt, P-3.3, 1.2VP·HighVt, and 1.2VP·LowVt, with the condition of the acceleration energy of 240 keV, the dose amount of $4\times10^{12}/cm^2$. This ion implantation is serving as both for a high threshold control of the P-channel high voltage transistor and for forming the channel stop region of the P-channel low voltage transistor. The implanted impurities are denoted by doped impurities 10. The resist pattern 15 is then removed by the ashing treatment, and so on.

Subsequently, the impurity is doped into the active region of the flash memory.

Figure 4A:
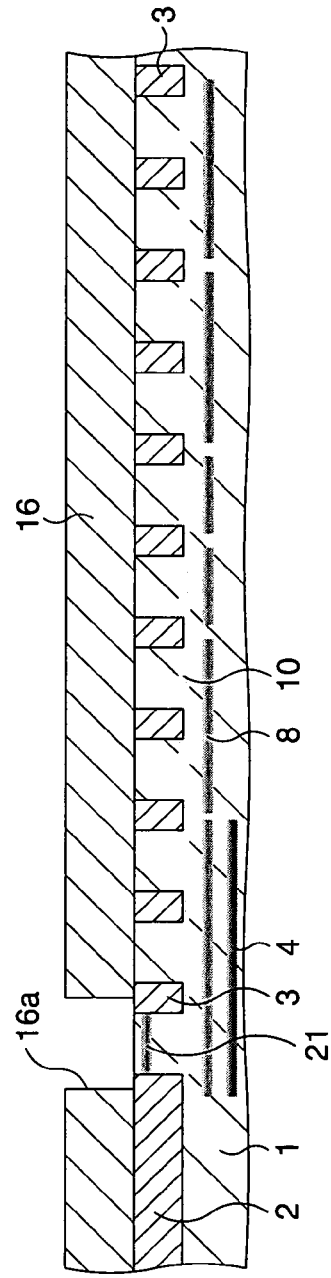
FIG. 4A, FIG. 4B, and FIG. 4C are schematic sectional views showing the manufacturing method of the semiconductor device according to the first embodiment in process sequence following to FIG. 3C.

As shown in FIG. 4A, the resist is coated on the silicon substrate 1, the corresponding resist is processed by the lithography, and an opening 16a including the active region of the flash memory is formed to form a resist pattern 16. Next, this resist pattern 16 is used as the mask, and the P-type impurity for a threshold control of the flash memory, here boron (B+) is ion implanted into the active region of the flash memory, with the condition of the acceleration energy of 40 keV, the dose amount of $6\times10^{13}/cm^2$. The implanted impurity is denoted by a doped impurity 21. The resist pattern 16 is then removed by the ashing treatment, and so on.

Subsequently, a tunnel oxide film of the flash memory is formed.

Figure 4B:
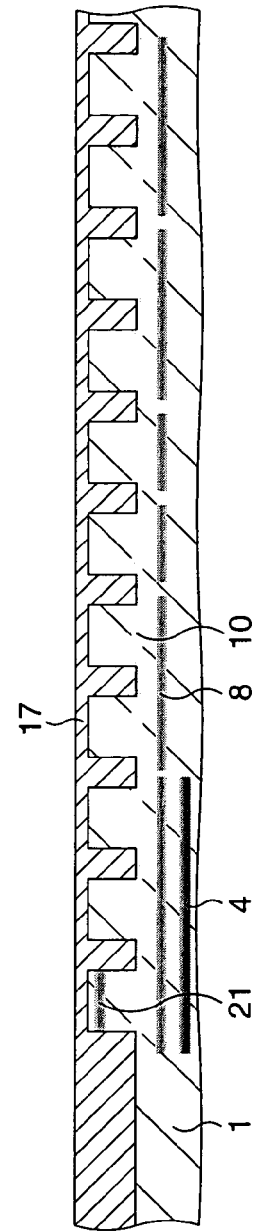

As shown in FIG. 4B, after the silicon oxide films on the surfaces of the respective active regions are removed by a wet etching using an HF solution, the surfaces of the respective active regions are performed a thermal oxidation annealing at a temperature of 900° C. to 1050° C. for 30 minutes, to form a tunnel oxide film 17 with a film thickness of approximately 10 nm.

Subsequently, a floating gate electrode and an ONO film are formed.

Figure 4C:
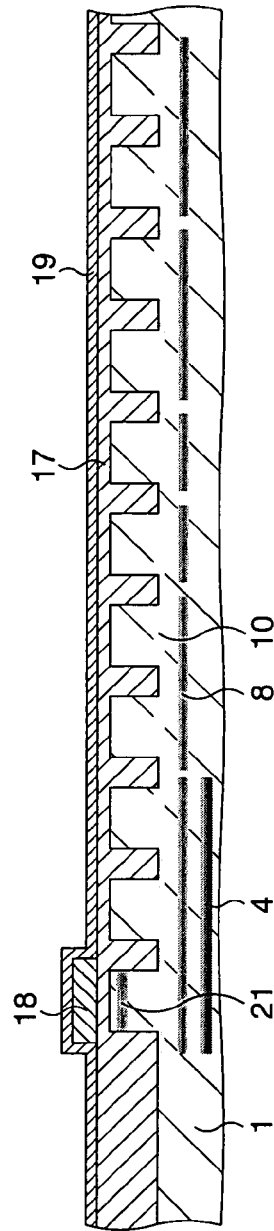

As shown in FIG. 4C, an amorphous silicon film into which phosphorus (P) is doped by, for example, a CVD method is formed on a whole surface of the substrate with the film thickness of approximately 90 nm. This amorphous silicon film is processed by the lithography and a dry etching, left on the active region of the flash memory in an island shape, to form a floating gate electrode 18. Next, for example, by using the CVD method, an SiO film with the film thickness of approximately 5 nm, an SiN film with the film thickness of approximately 10 nm are grown in this sequence, and thereafter, the surface of the SiN film is thermal oxidized, for example, at 950° C. for 90 minutes, to form the SiO film with the film thickness of approximately 30 nm at a top layer. At this time, an ONO film 19 with a three-layer structure, in which the SiO film, the SiN film, and the SiO film are sequentially stacked, is formed. Incidentally, for the convenience of showing in the drawing, the ONO film 19 is shown in one layer. Incidentally, by heat treatments at the time of forming the tunnel oxide film 17 and the thermal oxidation of the surface of the SiN film, the doped impurities of the respective wells are diffused for approximately 0.1 µm to 0.2 µm or more, and become to be in broad states.

Subsequently, the impurity is doped into the active region of N-3.3.

Figures 5A, 5B, 5C:
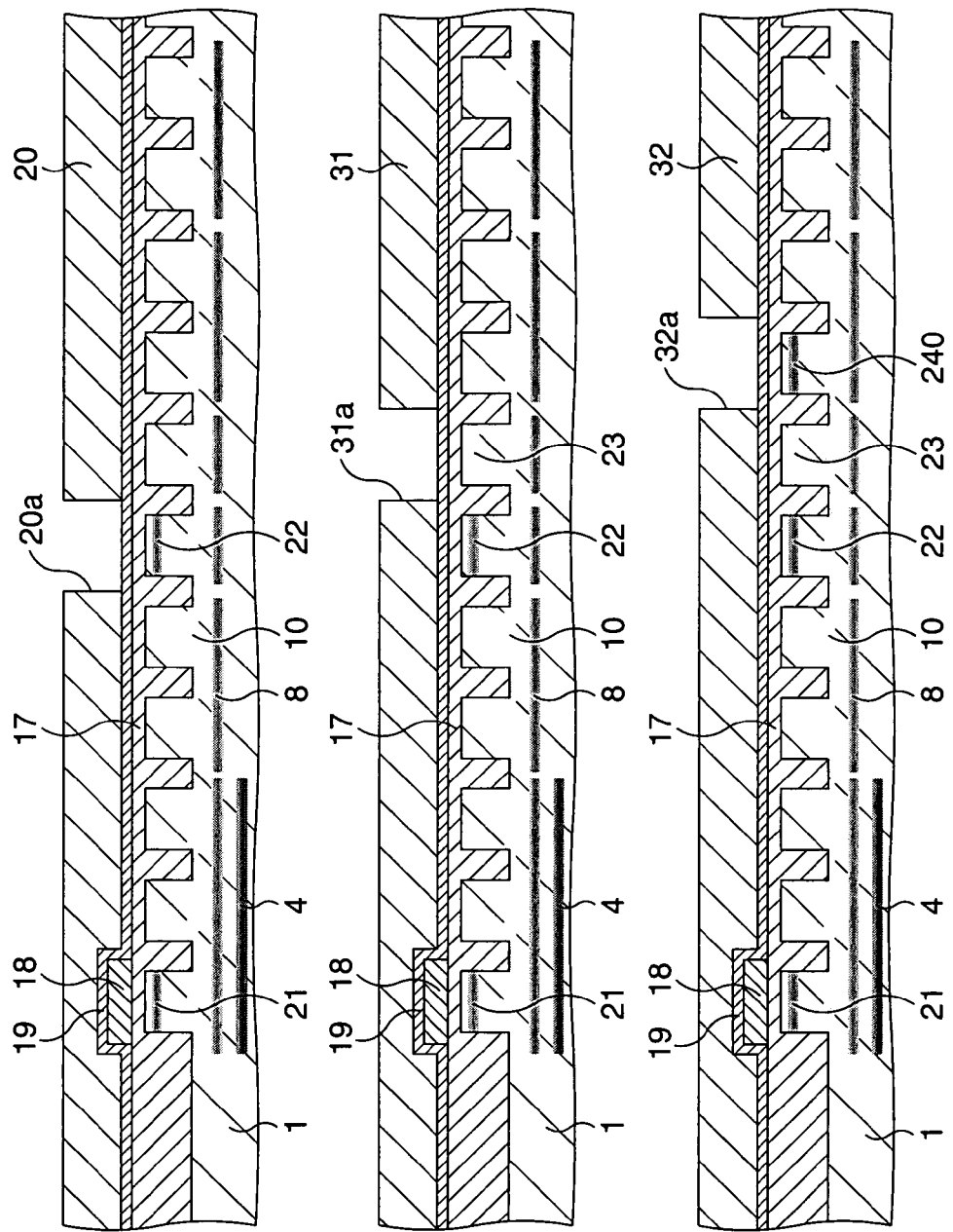
FIG. 5A, FIG. 5B, and FIG. 5C are schematic sectional views showing the manufacturing method of the semiconductor device according to the first embodiment in process sequence following to FIG. 4C.

As shown in FIG. 5A, the resist is coated on the silicon substrate 1, the corresponding resist is processed by the lithography, and an opening 20a including the active region of N-3.3 is formed to form a resist pattern 20. Next, this resist pattern 20 is used as the mask, and the P-type impurity, here boron (B$^+$) is ion implanted into the active region of N-3.3 via the ONO film 19, with the condition of the acceleration energy of 35 keV, the dose amount of 5×10$^{12}$/cm$^2$. The implanted impurity is denoted by a doped impurity 22. The resist pattern 20 is then removed by the ashing treatment, and so on.

Subsequently, the impurity is doped into the active region of P-3.3.

As shown in FIG. 5B, the resist is coated on the silicon substrate 1, the corresponding resist is processed by the lithography, and an opening 31a including the active region of P-3.3 is formed to form a resist pattern 31. Next, this resist pattern 31 is used as the mask, and the N-type impurity, here arsenic (As$^+$) is ion implanted into the active region of P-3.3 via the ONO film 19, with the condition of the acceleration energy of 150 keV, the dose amount of 2×10$^{12}$/cm$^2$. The implanted impurity is denoted by a doped impurity 23. The resist pattern 31 is then removed by the ashing treatment, and so on.

Subsequently, the impurity is doped into the active region of 1.2VN·HighVt.

As shown in FIG. 5C, the resist is coated on the silicon substrate 1, the corresponding resist is processed by the lithography, and an opening 32a including the active region of 1.2VN·HighVt is formed to form a resist pattern 32. Next, this resist pattern 32 is used as the mask, and the P-type impurity, here boron (B+) is ion implanted into the active region of 1.2VN·HighVt via the ONO film 19, with the condition of the acceleration energy of 15 keV, the dose amount of 7×10$^{12}$/cm$^2$. The implanted impurity is denoted by a doped impurity 24. The resist pattern 32 is then removed by the ashing treatment, and so on.

Subsequently, the impurity is doped into the active region of 1.2VP·HighVt.

As shown in FIG. 6A, the resist is coated on the silicon substrate 1, the corresponding resist is processed by the lithography, and an opening 33a including the active region of 1.2VP·HighVt is formed to form a resist pattern 33. Next, this resist pattern 33 is used as the mask, and the N-type impurity, here arsenic (As$^+$) is ion implanted into the active region of 1.2VP·HighVt via the ONO film 19, with the condition of the acceleration energy of 150 keV, the dose amount of 6×10$^{12}$/cm$^2$. The implanted impurity is denoted by a doped impurity 25. The resist pattern 33 is then removed by the ashing treatment, and so on.

Subsequently, the ONO film 19 is processed.

As shown in FIG. 6B, the resist is coated on the ONO film 19, the corresponding resist is processed by the lithography, and a resist pattern 34 is formed on the ONO film 19 so as to include the floating gate electrode 18. Next, this resist pattern 34 is used as the mask, the ONO film 19 is dry etched, and the ONO film 19 is processed into a shape to cover the floating gate electrode 18 on the active region of the flash memory. The resist pattern 34 is then removed by the ashing treatment, and so on.

Subsequently, an SiO film is formed at the respective active regions of 5VN·LowVt, 5VN·Highvt, 5VP·LowVt, and 5VP·HighVt.

As shown in FIG. 6C, an SiO film 26 is formed at the respective active regions except for the active region of the flash memory by the thermal oxidation method at 850° C. to be the film thickness of approximately 13 nm. Next, the resist is coated on the SiO film 26, the corresponding resist is processed by the lithography, and a resist pattern 35 in the shape including the respective active regions of the flash memory, 5VN·LowVt, 5VN·HighVt, 5VP·LowVt, and 5VP·HighVt, is formed on the SiO film 26. The resist pattern 35 is used as the mask, the SiO film 26 is etched, and the SiO film 26 is left only at the respective active regions of 5VN·LowVt, 5VN·HighVt, 5VP·LowVt, and 5VP·HighVt. The resist pattern 35 is then removed by the ashing treatment, and so on.

Subsequently, the SiO film is formed at the respective active regions of N-3.3 and P-3.3.

Figures 7A, 7B, 7C:
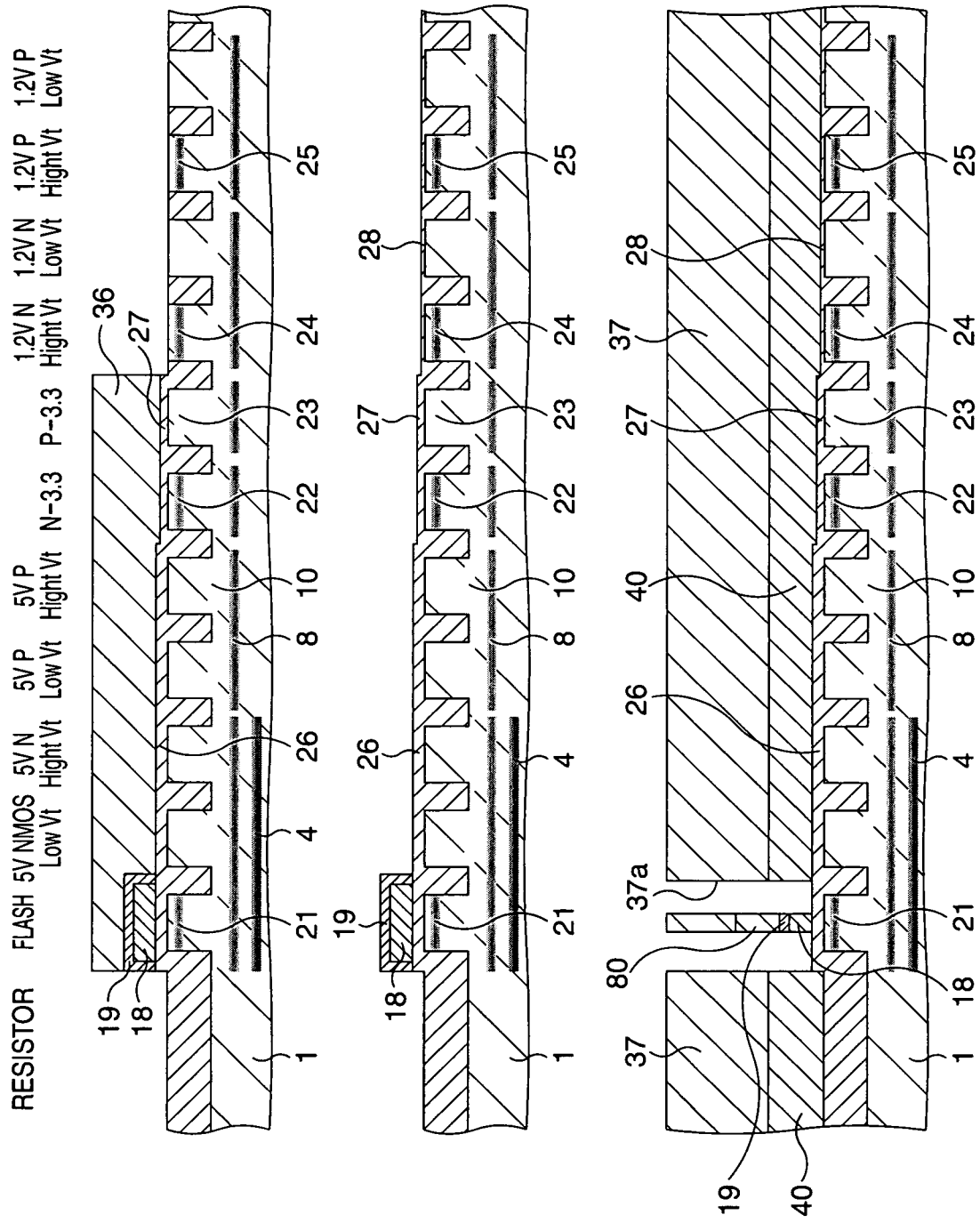
FIG. 7A, FIG. 7B, and FIG. 7C are schematic sectional views showing the manufacturing method of the semiconductor device according to the first embodiment in process sequence following to FIG. 6C.

As shown in FIG. 7A, the surface of the silicon substrate 1 is thermal oxidized. At this time, an SiO film 27 with the film thickness of approximately 6 nm is formed at the respective active regions of N-3.3, P-3.3, 1.2VN·HighVt, 1.2VN·LowVt, 1.2VP·HighVt, and 1.2VP·LowVt, whose surfaces are exposed within the respective active regions. At the same time, the film thickness of the SiO film 26 at the respective active regions of 5VN·LowVt, 5VN·Highvt, 5VP·LowVt, and 5VP·HighVt increases. Next, the resist is coated on the SiO films 26 and 27, the corresponding resist is processed by the lithography, and a resist pattern 36 in the shape including the respective active regions of the flash memory, 5VN·LowVt, 5VN·HighVt, 5VP·LowVt, 5VP·HighVt, N-3.3, and P-3.3 is formed on the SiO films 26 and 27 is formed. The resist pattern 36 is used as the mask, the SiO film 27 is etched, and the SiO film 27 is left only at the respective active regions of N-3.3 and P-3.3. The resist pattern 36 is then removed by the ashing treatment, and so on.

Subsequently, the SiO film is formed at the respective active regions of 1.2VN·HighVt, 1.2VN·LowVt, 1.2VP·HighVt, and 1.2VP·LowVt.

As shown in FIG. 7B, the surface of the silicon substrate 1 is thermal oxidized. At this time, an SiO film 28 with the film thickness of approximately 2.2 nm is formed at the respective active regions of 1.2VN·HighVt, 1.2VN·LowVt, 1.2VP·HighVt, and 1.2VP·LowVt, whose surfaces are exposed within the respective active regions. At the same time, the film thickness of the SiO film 26 at the respective active regions of 5VN·LowVt, 5VN·HighVt, 5VP·LowVt, and 5VP·HighVt, and the film thicknesses of the SiO film 27 at the respective active regions of N-3.3 and P-3.3 increase. Here, for example, the film thickness of the SiO film 26 becomes approximately 16 nm at a region of high voltage (5 V) driving, the film thickness of the SiO film 27 becomes approximately 7 nm at a region of middle voltage (3.3 V) driving, the film thickness of the SiO film 28 becomes approximately 2.2 nm at a region of low voltage (1.2 V) driving, and they function as gate insulating films at the respective regions.

Subsequently, a control gate electrode of the flash memory is formed.

As shown in FIG. 7C, a polycrystalline silicon film 40 is accumulated on the whole surface of the silicon substrate 1 to be the film thickness of approximately 180 nm by the CVD method, and thereafter, a silicon nitride film (not shown) is accumulated on the polycrystalline silicon film 40 to be the film thickness of approximately 30 nm as an antireflection material and as an etching mask material. Next, the resist is coated, processed by a photolithography, and an opening 37a exposing the active region of the flash memory to leave the resist in electrode shape is formed, to form a resist pattern 37. Next, this resist pattern 37 is used as the mask, the silicon nitride film is dry etched to be an etching mask, and the polycrystalline silicon film 40, the ONO film 19, and the floating gate electrode 18 are further dry etched. The polycrystalline silicon film 40 is left as a control gate electrode 80 extending via the ONO film 19 on the floating gate electrode 18, and also left so as to respectively cover the forming region of the resistor and the whole respective active regions other than the flash memory. The resist pattern 37 is then removed by the ashing treatment, and so on.

Subsequently, LDD regions are formed at the active region of the flash memory.

Figures 8A, 8B, 8C:
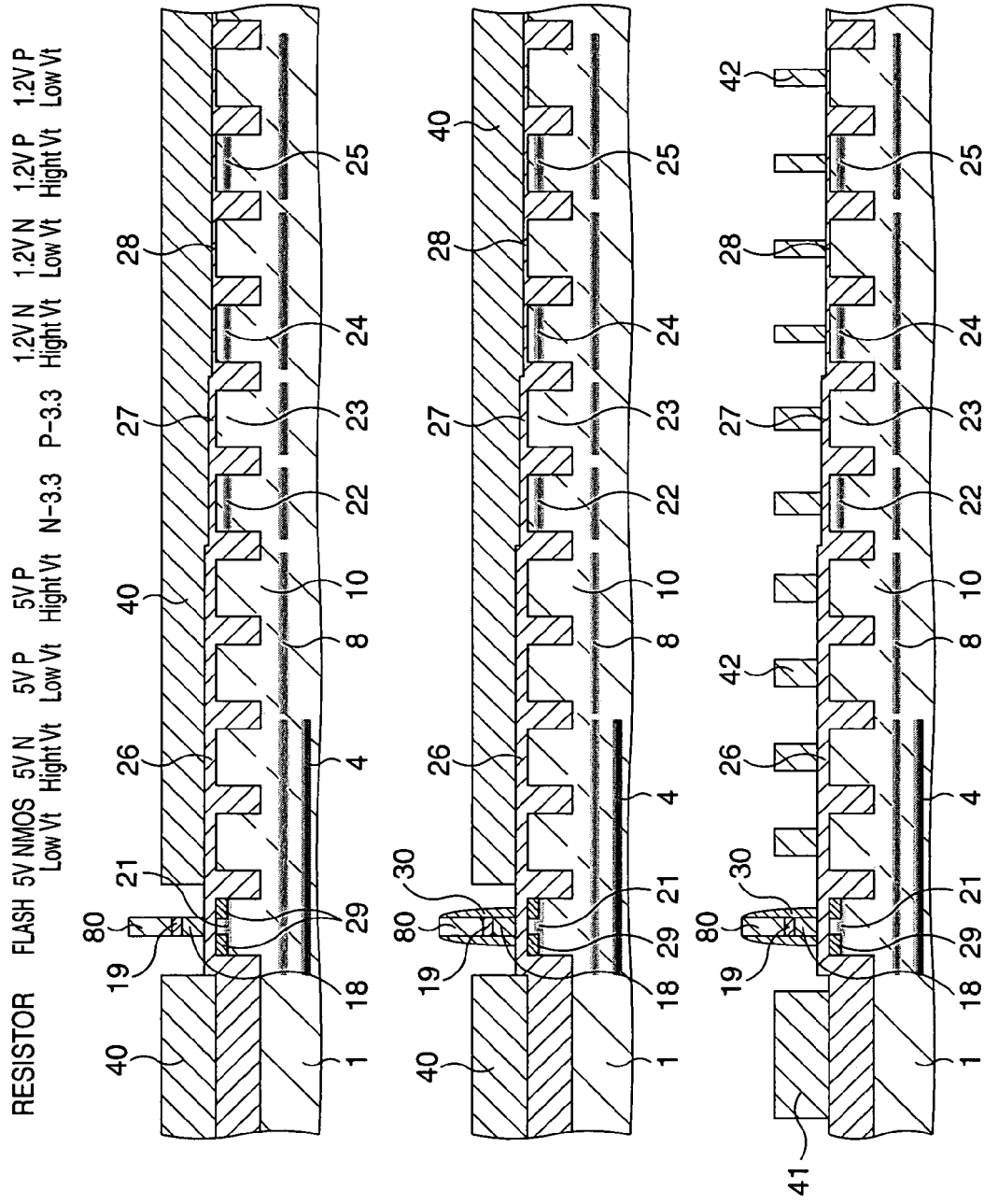
FIG. 8A, FIG. 8B, and FIG. 8C are schematic sectional views showing the manufacturing method of the semiconductor device according to the first embodiment in process sequence following to FIG. 7C.

As shown in FIG. 8A, at first, both side surfaces of the floating gate electrode 18, the ONO film 19, and the control gate electrode 80 are thermal oxidized to form a silicon oxide film (not shown) with the film thickness of approximately 10 nm, and thereafter, a resist pattern (not shown) in a shape to open only the active region of the flash memory is formed by the lithography. Next, this resist pattern and the control gate electrode 80 are used as the masks, and the N-type impurity, here arsenic (As$^+$) is ion implanted into both sides of the polycrystalline silicon film 40 at the active region of the flash memory, with the condition of the acceleration energy of 50 keV, the dose amount of $6 \times 10^{14}/cm^2$, to form LDD (Lightly Doped Drain) regions 29. The above-stated resist pattern is then removed by the ashing treatment, and so on.

Subsequently, side wall spacers are formed at the both side surfaces of the floating gate electrode 18, the ONO film 19, and the control gate electrode 80 of the flash memory.

As shown in FIG. 8B, at first, the both side surfaces of the floating gate electrode 18, the ONO film 19, and the control gate electrode 80 are thermal oxidized again to form a silicon oxide film (not shown) with the film thickness of approximately 10 nm. Next, a silicon nitride film is accumulated on the whole surface by, for example, a thermal CVD method, the whole surface of this silicon nitride film is anisotropic etched (etch back) by, for example, an RIE, to form side wall spacers 30 to be the film thickness of approximately 100 nm by leaving the silicon nitride film at the both side surfaces of the floating gate electrode 18, the ONO film 19, and the control gate electrode 80.

Subsequently, gate electrodes of the resistor and the respective active regions are pattern formed.

As shown in FIG. 8C, the polycrystalline silicon film 40 other than the control gate electrode 80 are processed by the lithography and the dry etching, to pattern form a resistor 41 at the forming region of the resistor and gate electrodes 42 at the respective active regions other than the flash memory. The resist pattern (not shown) used for the mask is then removed by the ashing treatment, and so on.

Subsequently, the LDD regions are formed at the active region of N-3.3.

As shown in FIG. 9A, the resist is coated on the silicon substrate 1, the corresponding resist is processed by the lithography, and an opening 38a exposing the active region of N-3.3 is formed to form a resist pattern 38. Next, the resist pattern 38 and the gate electrode 42 at the active region of N-3.3 are used as the masks, and the N-type impurity, here phosphorus (P$^+$) is ion implanted into the both sides of the gate electrode 42 at the active region of N-3.3 via the SiO film 27, with the condition of the acceleration energy of 35 keV, the dose amount of $4 \times 10^{13}/cm^2$ to form LDD regions 43. The resist pattern 38 is then removed by the ashing treatment, and so on.

Subsequently, the LDD regions are formed at the active region of P-3.3.

As shown in FIG. 9B, the resist is coated on the silicon substrate 1, the corresponding resist is processed by the lithography, and an opening 39a exposing the active region of P-3.3 is formed to form a resist pattern 39. Next, the resist pattern 39 and the gate electrode 42 at the active region of P-3.3 are used as the masks, and the P-type impurity, here BF$_2^+$ is ion implanted into the both sides of the gate electrode 42 at the active region of P-3.3 via the SiO film 27, with the condition of the acceleration energy of 10 keV, the dose amount of $4 \times 10^{13}/cm^2$ to form LDD regions 44. The resist pattern 39 is then removed by the ashing treatment, and so on.

Subsequently, the LDD regions are formed at the respective active regions of 1.2VN·HighVt and 1.2VN·LowVt.

Figure 10A:
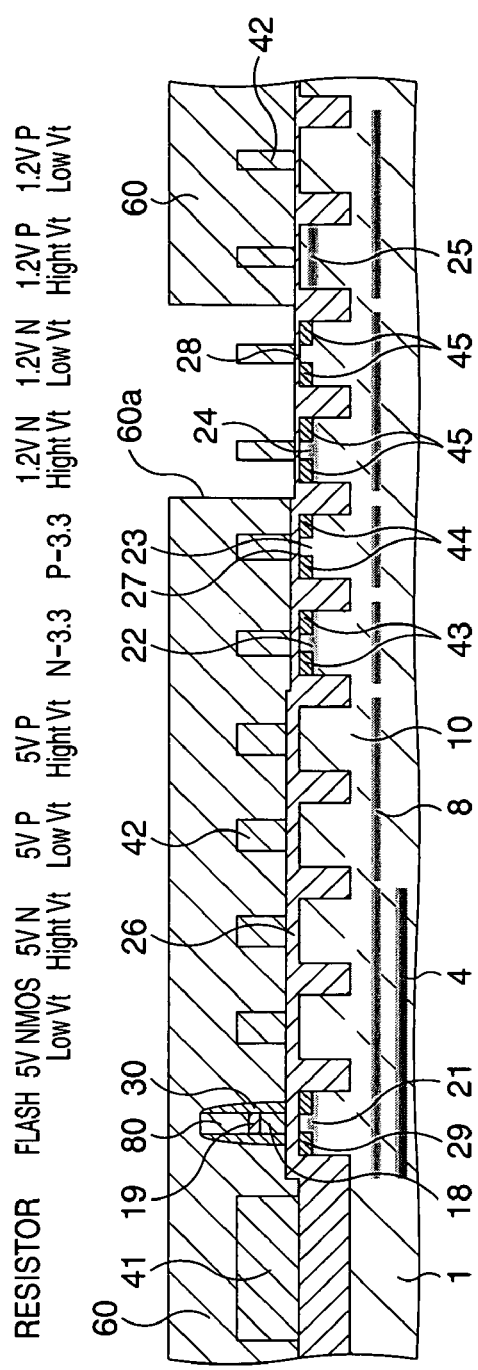
FIG. 10A and FIG. 10B are schematic sectional views showing the manufacturing method of the semiconductor device according to the first embodiment in process sequence following to FIG. 9B.

As shown in FIG. 10A, the resist is coated on the silicon substrate 1, the corresponding resist is processed by the lithography, and an opening 60a including the respective active regions of 1.2VN·HighVt and 1.2VN·LowVt, is formed to form a resist pattern 60. Next, the resist pattern 60 and the gate electrodes 42 at the respective active regions of 1.2VN·HighVt and 1.2VN·LowVt, are respectively used as the masks, and the N-type impurity, here arsenic (As$^+$) is ion implanted into the both sides of the gate electrodes 42 at the respective active regions of 1.2VN·Highvt, 1.2VN·LowVt, via the SiO film 28, with the condition of the acceleration energy of 3 keV, the dose amount of $1.2 \times 10^{15}/cm^2$, and further, the P-type impurity, here BF$_2^+$ is ion implanted from four directions, for example, inclined at 28° from a normal line relative to the silicon substrate 1, with the condition of the acceleration energy of 80 keV, the dose amount of $6 \times 10^{12}/cm^2$ to form LDD regions 45. The resist pattern 60 is then removed by the ashing treatment, and so on.

Subsequently, the LDD regions are formed at the respective active regions of 1.2VP·HighVt and 1.2VP·LowVt.

Figure 10B:
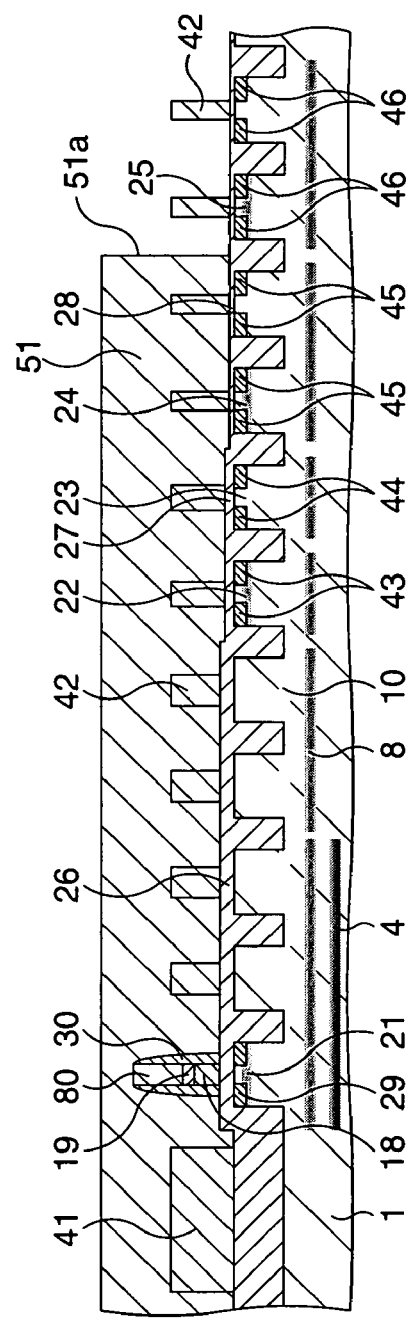

As shown in FIG. 10B, the resist is coated on the silicon substrate 1, the corresponding resist is processed by the lithography, and an opening 51a including the respective active regions of 1.2VP·HighVt and 1.2VP·LowVt is formed to form a resist pattern 51. Next, the resist pattern 51 and the gate electrodes 42 at the respective active regions of 1.2VP·HighVt and 1.2VP·LowVt, are respectively used as the masks, and the P-type impurity, here boron (B$^+$) is ion implanted into the both sides of the gate electrodes 42 at the respective active regions of 1.2VP·HighVt and 1.2VP·LowVt, via the SiO film 28, with the condition of the acceleration energy of 0.5 keV, the dose amount of $5.7 \times 10^{14}/cm^2$, and further, the N-type impurity, here arsenic (As$^+$) is ion implanted from the four directions, for example, inclined at 28° from the normal line relative to the silicon substrate 1, with the condition of the acceleration energy of 120 keV, the dose amount of $7 \times 10^{12}/cm^2$ to form LDD regions 46. The resist pattern 51 is then removed by the ashing treatment, and so on.

Subsequently, the LDD regions are formed at the respective active regions of 5VN·LowVt and 5VN·HighVt.

Figure 11A:
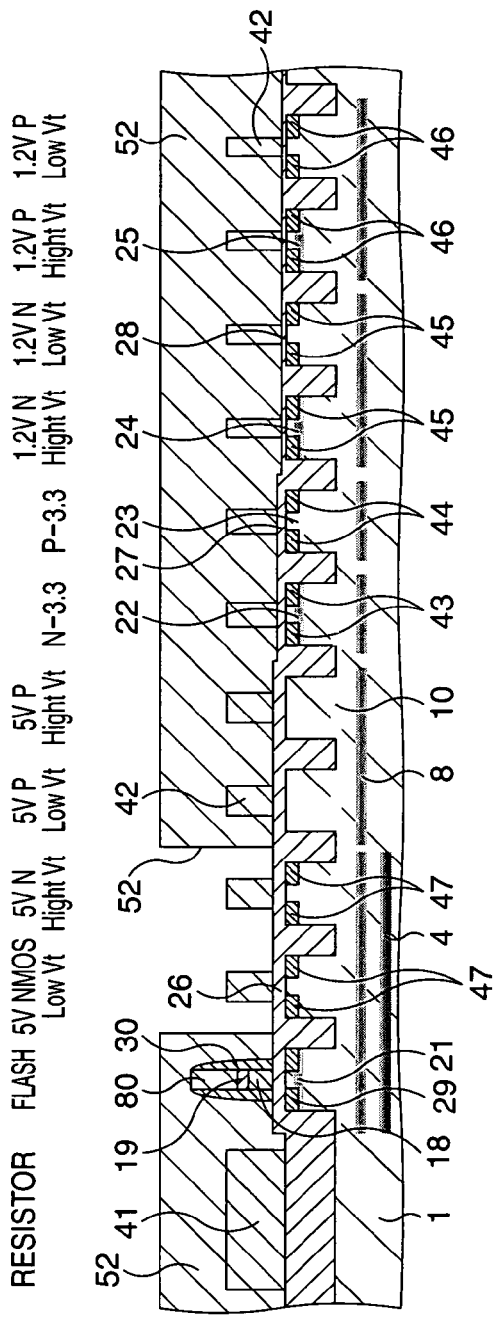
FIG. 11A and FIG. 11B are schematic sectional views showing the manufacturing method of the semiconductor device according to the first embodiment in process sequence following to FIG. 10B.

As shown in FIG. 11A, the resist is coated on the silicon substrate 1, the corresponding resist is processed by the lithography, and an opening 52a including the respective active regions of 5VN·LowVt and 5VN·HighVt is formed to form a resist pattern 52. Next, the resist pattern 52 and the gate electrodes 42 at the respective active regions of 5VN·LowVt and 5VN·HighVt, are respectively used as the masks, and the N-type impurity, here arsenic (As$^+$) is ion implanted into the both sides of the gate electrodes 42 at the respective active regions of 5VN·LowVt and 5VN·HighVt, via the SiO film 26, with the condition of the acceleration energy of 120 keV, the dose amount of $6 \times 10^{12}/cm^2$ from the four directions, for example, inclined at 28° from the normal line relative to the silicon substrate 1 to form LDD regions 47. The resist pattern 52 is then removed by the ashing treatment, and so on.

Subsequently, the LDD regions are formed at the respective active regions of 5VP·LowVt and 5VP·HighVt.

Figure 11B:
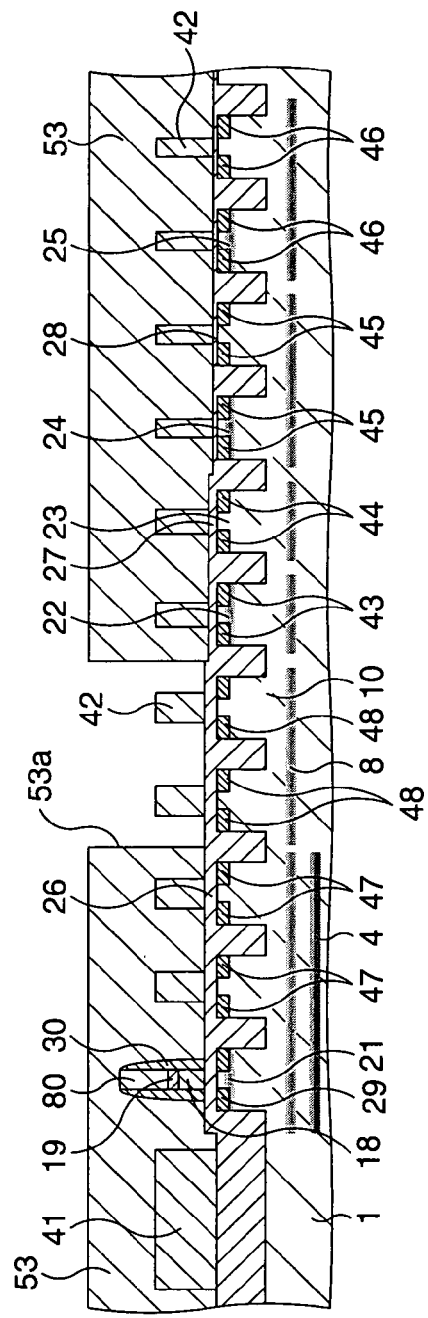

As shown in FIG. 11B, the resist is coated on the silicon substrate 1, the corresponding resist is processed by the lithography, and an opening 53a including the respective active regions of 5VP·LowVt and 5VP·HighVt is formed to form a resist pattern 53. Next, the resist pattern 53 and the gate electrodes 42 at the respective active regions of 5VP·LowVt and 5VP·HighVt are respectively used as the masks, and the P-type impurity, here $BF_2^+$ is ion implanted into the both sides of the gate electrodes 42 at the respective active regions of 5VP·LowVt and 5VP·Highvt, via the SiO film 26, with the condition of the acceleration energy of 80 keV, the dose amount of $4.5 \times 10^{12}/cm^2$ from the four directions, for example, inclined at 28° from the normal line relative to the silicon substrate 1 to form LDD regions 48. The resist pattern 53 is then removed by the ashing treatment, and so on.

Subsequently, the impurity is doped into the resistor 41 to form a resistance element 81.

As shown in FIG. 12A, the resist is coated on the silicon substrate 1, the corresponding resist is processed by the lithography, and an opening 54a exposing only the resistor 41 is formed to form a resist pattern 54. Next, the resist pattern 54 is used as the mask, and the impurity, here boron (B+) being the P-type impurity is ion implanted into the resistor 41, with the condition of the acceleration energy of 8 keV, the dose amount of $2 \times 10^{15}/cm^2$ to form the resistance element 81. The resist pattern 54 is then removed by the ashing treatment, and so on.

Subsequently, a silicon oxide film is formed on a whole surface including a surface of the resistance element 81.

As shown in FIG. 12B, just after the resist pattern 54 is removed, a silicon oxide film 49 as an insulating film is accumulated to be the film thickness of approximately 130 nm so as to cover the whole surface of the silicon substrate 1 including the surface of the resistance element 81 by, for example, the thermal CVD method. Next, the resist is coated on the silicon oxide film 49, the corresponding resist is processed by the lithography, to form a resist pattern 55 having a shape covering a part corresponding to an upper portion of the resistance element 81 on the silicon oxide film 49, here to cover only a center portion of the resistance element 81.

Subsequently, a silicide block layer and side wall spacers are formed at the same time.

As shown in FIG. 12C, the resist pattern 55 is used as the mask, and the whole surface of the silicon oxide film 49 is dry etched. At this time, the resist pattern 55 is working as the mask to leave the silicon oxide film 49 at the center portion on the resistance element 81, and a silicide block layer 50 is pattern formed. At the same time, the silicon oxide film 49 is etched back, side wall spacers 61 are formed so as to cover the both side surfaces of the resistance element 81, to cover the side wall spacers 30 at the active region of the flash memory, and to respectively cover the both side surfaces of the gate electrodes 42 at the respective active regions of 5VN·LowVt, 5VN·HighVt, 5VP·LowVt, 5VP·HighVt, N-3.3, P-3.3, 1.2VN·HighVt, 1.2VN·LowVt, 1.2VP·HighVt, and 1.2VP·LowVt.

Subsequently, source/drain (S/D) regions are formed at the respective active regions of 5VP·LowVt, 5VP·HighVt, P-3.3, 1.2VP·HighVt, and 1.2VP·LowVt.

As shown in FIG. 13A, the resist is coated on the silicon substrate 1, the corresponding resist is processed by the lithography, and openings 55a including the respective active regions of 5VP·LowVt, 5VP·Highvt, P-3.3, 1.2VP·HighVt, and 1.2VP·Lowvt are formed to form a resist pattern 55. Next, the resist pattern 55 is used as the mask, and the P-type impurity, here boron (B+) is ion implanted into the respective active regions of 5VP·LowVt, 5VP·HighVt, P-3.3, 1.2VP·HighVt, and 1.2VP·LowVt, with the condition of the acceleration energy of 5 keV, the dose amount of $4 \times 10^{15}/cm^2$ to form source/drain regions 62 matching to positions of the respective side wall spacers 61 at the respective active regions. At this time, boron (B$^+$) is ion implanted into the gate electrodes 42 at the respective active regions of 5VP·LowVt, 5VP·HighVt, P-3.3, 1.2VP·HighVt, and 1.2VP·LowVt at the same time, and the corresponding respective gate electrodes 42 become to be the P-type. At this time, respective transistors are formed at the respective active regions of 5VP·LowVt, 5VP·HighVt, P-3.3, 1.2VP·HighVt, and 1.2VP·LowVt. The resist pattern 55 is then removed by the ashing treatment, and so on.

Subsequently, the source/drain (S/D) regions are formed at the respective active regions of the flash memory, 5VN·LowVt, 5VN·HighVt, N-3.3, 1.2VN·HighVt, and 1.2VN·LowVt.

As shown in FIG. 13B, the resist is coated on the silicon substrate 1, the corresponding resist is processed by the lithography, and openings 56a including the respective active regions of the flash memory, 5VN·LowVt, 5VN·HighVt, N-3.3, 1.2VN·HighVt, and 1.2VN·LowVt are formed to form a resist pattern 56. Next, the resist pattern 56 is used as the mask, and the N-type impurity, here phosphorus (P$^+$) is ion implanted into the respective active regions of the flash memory, 5VN·LowVt, 5VN·HighVt, N-3.3, 1.2VN·HighVt, and 1.2VN·LowVt, with the condition of the acceleration energy of 10 keV, the dose amount of $6\times10^{15}/cm^2$ to form source/drain regions 63 matching to the positions of the respective side wall spacers 61 at the respective active regions. At this time, phosphorus (P$^+$) is ion implanted into the control gate electrode 80 of the flash memory and the gate electrodes 42 at the respective active regions of 5VN·LowVt, 5VN·HighVt, N-3.3, 1.2VN·HighVt, and 1.2VN·LowVt at the same time, and the control gate electrode 80 and the respective gate electrodes 42 become to be N-type. At this time, respective transistors (a memory cell at the active region of the flash memory) are formed at the respective active regions of the flash memory, 5VN·LowVt, 5VN·HighVt, N-3.3, 1.2VN·HighVt, and 1.2VN·LowVt. The resist pattern 56 is then removed by the ashing treatment, and so on.

Subsequently, an anneal treatment is performed to the silicon substrate 1. Here, a rapid anneal treatment (RTA) is performed, for example, at 1025° C., under a nitride (N$_2$) atmosphere, for three seconds. Herewith, the respective impurities ion implanted at the above-stated respective processes such as boron (B$^+$) in the resistance element 81 and boron (B$^+$), phosphorus (P$^+$), in the source/drain regions 62 and 63, are activated.

Subsequently, the resistance element is silicided, and the respective transistors are salicided.

Figure 14A:
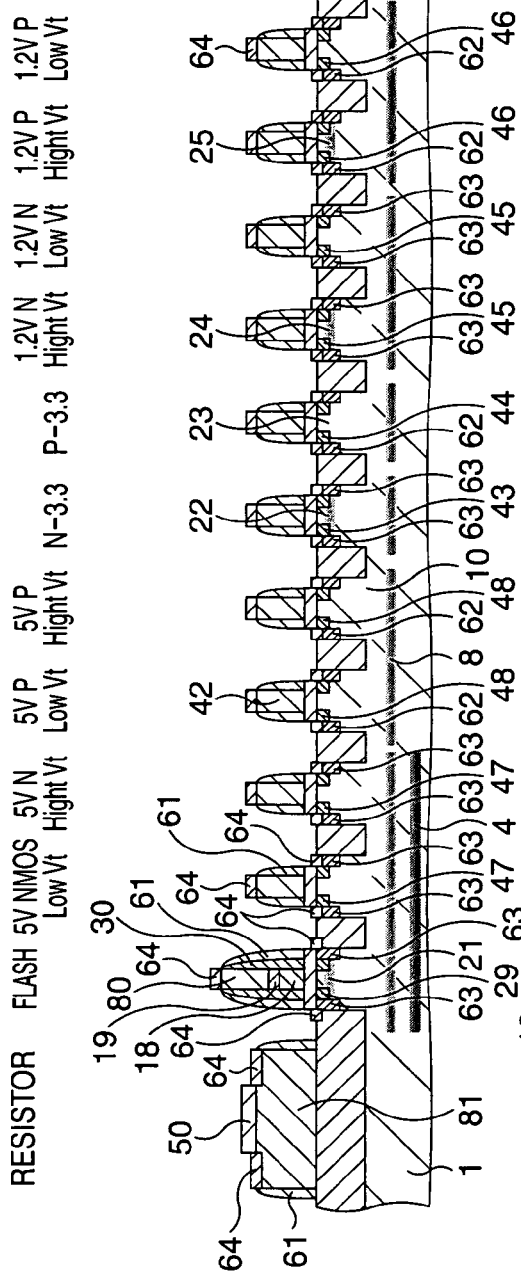
FIG. 14A and FIG. 14B are schematic sectional views showing the manufacturing method of the semiconductor device according to the first embodiment in process sequence following to FIG. 13B.

As shown in FIG. 14A, a silicide metal, here a Co film is accumulated on the whole surface of the silicon substrate 1 to be the film thickness of approximately 8 nm, and thereafter, a heat treatment is performed. By this heat treatment, silicide layers 64 in which the Co and the silicon are silicided, are respectively formed at the both sides of the silicide block layer 50 at the upper surface of the resistance element 81, and on the gate electrodes 42 and on the source/drain regions 62 and 63 at the respective transistors. After that, unreacted Co films are removed by a wet etching.

Subsequently, the semiconductor device is completed by passing through formations of interlayer insulation films, plugs for connection, wirings, and so on.

Figure 14B:
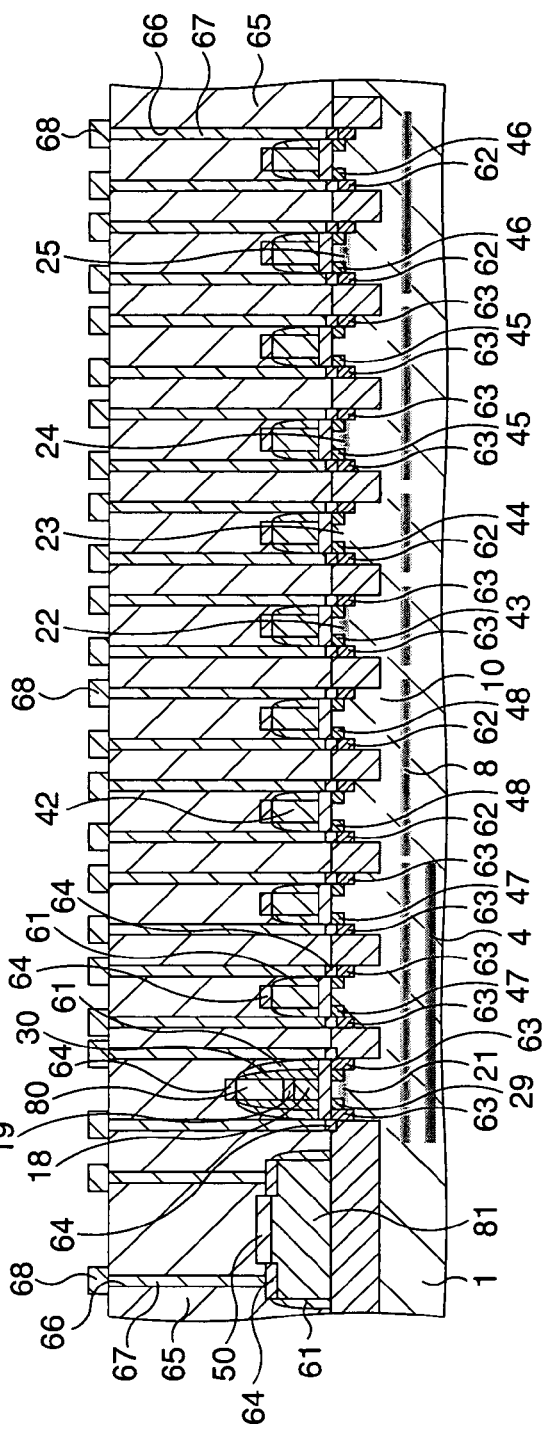

As shown in FIG. 14B, a silicon oxide film is accumulated on the whole surface of the silicon substrate 1 to be the film thickness of approximately 600 nm, so as to cover the resistance element 81 and the respective transistors by, for example, a high density plasma (HDP)-CVD method, to form an interlayer insulation film 65. Next, respective contact holes 66 are formed at the interlayer insulation film 65. The respective contact holes 66 are respectively formed so that parts of the surfaces of the silicide layers 64 at the both sides of the silicide block layer 50 are to be exposed as for the resistance element 81, and so that parts of the surfaces of the silicide layers 64 on the source/drain regions 62 and 63 are to be exposed as for the respective transistors.

Next, base films (not shown) such as a Ti or a TiN are formed so as to cover inside walls of the respective contact holes 66, and thereafter, for example, a tungsten (W) film is formed on the interlayer insulation film 65 so as to embed the respective contact holes 66 via the base films, and W plugs 67 are formed by smoothing the surface of the W film while using the interlayer insulation film 65 as a stopper by, for example, a CMP method (Chemical Mechanical Polishing).

Here, at the upper surface of the resistance element 81, the resistance element 81 and the W plugs 67 are connected via the silicide layers 64, and the resistance value (connection resistive component) of thes connecting portions can be reduced. In the present embodiment, the impurity is ion implanted into the resistor 41 pattern formed from the polycrystalline silicon film 40 to form the resistance element 81, and just after the resist pattern 54 being the mask for the ion implantation is removed, the silicon oxide film 49 to be the silicide block layer 50 is formed so as to cover the resistance element 81, and therefore, the resistance value of the resistance element 81 main body is stably defined to the desired value. Consequently, in the present embodiment, it becomes possible to stably control the resistance values of the connection resistive component and the resistance element 81 as a whole.

Next, a metallic film, for example, an aluminum (Al) film is accumulated on the surface of the interlayer insulation film 65 by, for example, a spattering method, this Al film is processed into wiring shapes on the respective W plugs 67 by the lithography and the dry etching, and respective wirings 68 which are electrically connected to the various connecting portions via the W plugs 67 are pattern formed.

The semiconductor device is thereafter completed by passing through the formation of the further interlayer insulation films, the plugs for connection, the wirings, and so on.

As described above, according to the present embodiment, as for the resistance value of the resistance element 81, the resistance values of not only the connection resistive component but also the resistance element 81 main body can be stably controlled easily and precisely without increasing the number of processes, and the semiconductor device including the resistance element 81 with high reliability can be realized. Besides, in this case, the increase in the number of processes can be suppressed as much as possible by forming the resistor 41 and the gate electrodes 42 of the respective transistors at the same time, while realizing the above-stated stable control of the resistance value.

MODIFICATION EXAMPLE

Here, a modification example of the first embodiment is described. In the present modification example, a manufacturing method of a semiconductor device including a resistance element and 11 varieties of transistors is disclosed as same as in the first embodiment, but they are different in the point that an ion implantation into a resistor and the ion implantation into a part of active regions are performed at the same time.

FIG. 15A to FIG. 18 are schematic sectional views showing a main part of a manufacturing method of the semiconductor device according to the present modification example in process sequence. In the respective views, the resistance element and the 11 varieties of transistors (flash memory, 5VN·LowVt, 5VN·HighVt, 5VP·LowVt, 5VP·HighVt, N-3.3, P-3.3, 1.2VN·HighVt, 1.2VN·LowVt, 1.2VP·HighVt, and 1.2VP·LowVt) are formed from left side in sequence. Here, at upper portions of the respective views, a forming region of the resistance element and the active regions of the respective transistors are shown.

In the present modification example, at first, the respective processes being the same as in FIG. 1 to FIG. 11B in the first embodiment are performed. In FIG. 15A, a condition after the resist pattern 53 shown in FIG. 11B is removed is shown.

Subsequently, a silicon oxide film is formed on a whole surface.

As shown in FIG. 15B, a silicon oxide film 69 is accumulated to be a film thickness of approximately 130 nm so as to cover the whole surface of a silicon substrate 1 by, for example, a thermal CVD method.

Subsequently, side wall spacers are respectively formed at both side surfaces of a resistor 41, surfaces of the side wall spacers 30 of the flash memory, and both side surfaces of respective gate electrodes 42.

Figures 16A, 16B, 16C:
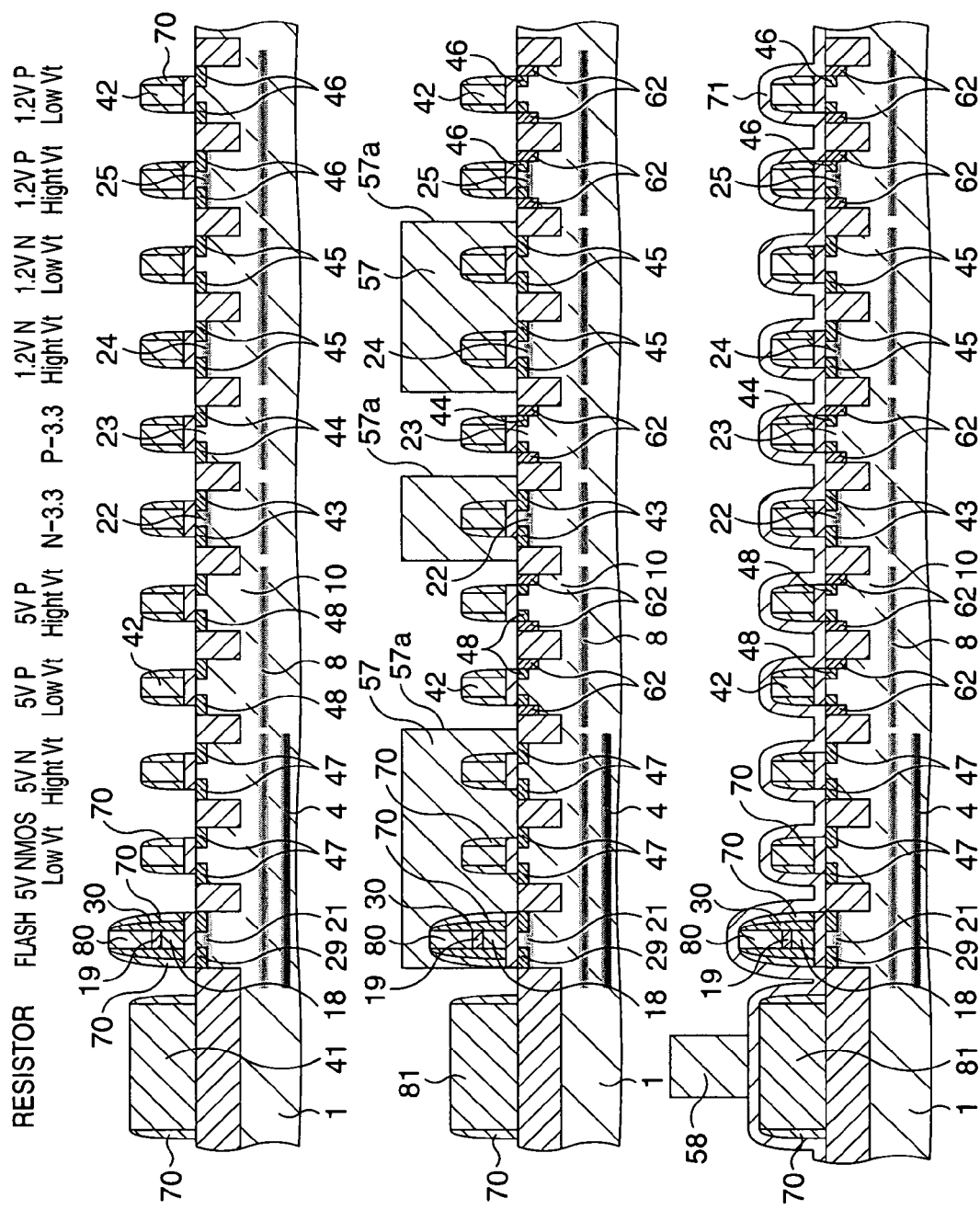
FIG. 16A, FIG. 16B, and FIG. 16C are schematic sectional views showing the manufacturing method of the semiconductor device according to the modification example of the first embodiment in process sequence following to FIG. 15B.

As shown in FIG. 16A, the whole surface of the silicon oxide film 69 is anisotropic etched (etch back), and the silicon oxide film 69 at the both side surfaces of the resistor 41, the surfaces of the side wall spacers 30 of the flash memory and the both side surfaces of the respective gate electrodes 42 are left to form side wall spacers 70.

Subsequently, the impurity is doped into the resistor 41 and the respective active regions of 5VP·LowVt, 5VP·HighVt, P-3.3, 1.2VP·HighVt and 1.2VP·LowVt, to form a resistance element 81 and source/drain regions at the same time.

As shown in FIG. 16B, a resist is coated on the silicon substrate 1, the corresponding resist is processed by a lithography, and openings 57a including the resistor 41, and the respective active regions of 5VP·LowVt, 5VP·HighVt, P-3.3, 1.2VP·HighVt, and 1.2VP·LowVt, are formed to form a resist pattern 57. Next, this resist pattern 57 is used as a mask, and a P-type impurity, here boron ($B^+$) is ion implanted into the resistor 41 and the respective active regions of 5VP·LowVt, 5VP·HighVt, P-3.3, 1.2VP·HighVt, and 1.2VP·LowVt, with a condition of an acceleration energy of 5 keV, a dose amount of $4 \times 10^{15}/cm^2$ to form source/drain regions 62 matching to positions of the resistance element 81 and the respective side wall spacers 70 at the respective active regions. At this time boron ($B^+$) is ion implanted into the gate electrodes 42 at the respective active regions of 5VP·LowVt, 5VP·HighVt, P-3.3, 1.2VP·HighVt, and 1.2VP·LowVt at the same time, and the corresponding respective gate electrodes 42 become to be the P-type. At this time, respective transistors are formed at the resistance element 81, and the respective active regions of 5VP·LowVt, 5VP·HighVt, P-3.3, 1.2VP·HighVt, and 1.2VP·LowVt. The resist pattern 57 is then removed by an ashing treatment, and so on.

Subsequently, a silicon oxide film is formed on a whole surface including a surface of the resistance element 81.

As shown in FIG. 16C, just after the resist pattern 57 is removed, a silicon oxide film 71 is accumulated to be the film thickness of approximately 100 nm so as to cover the whole surface of the silicon substrate 1 including the surface of the resistance element 81, by for example, a thermal CVD method. Next, the resist is coated on the silicon oxide film 71, the corresponding resist is processed by the lithography, and a resist pattern 58 in a shape to cover a part corresponding to an upper portion of the resistance element 81 on the silicon oxide film 71, here only a center portion of the resistance element 81, is formed.

Subsequently, a silicide block layer and side wall spacers are formed at the same time.

Figures 17A, 17B, 17C:
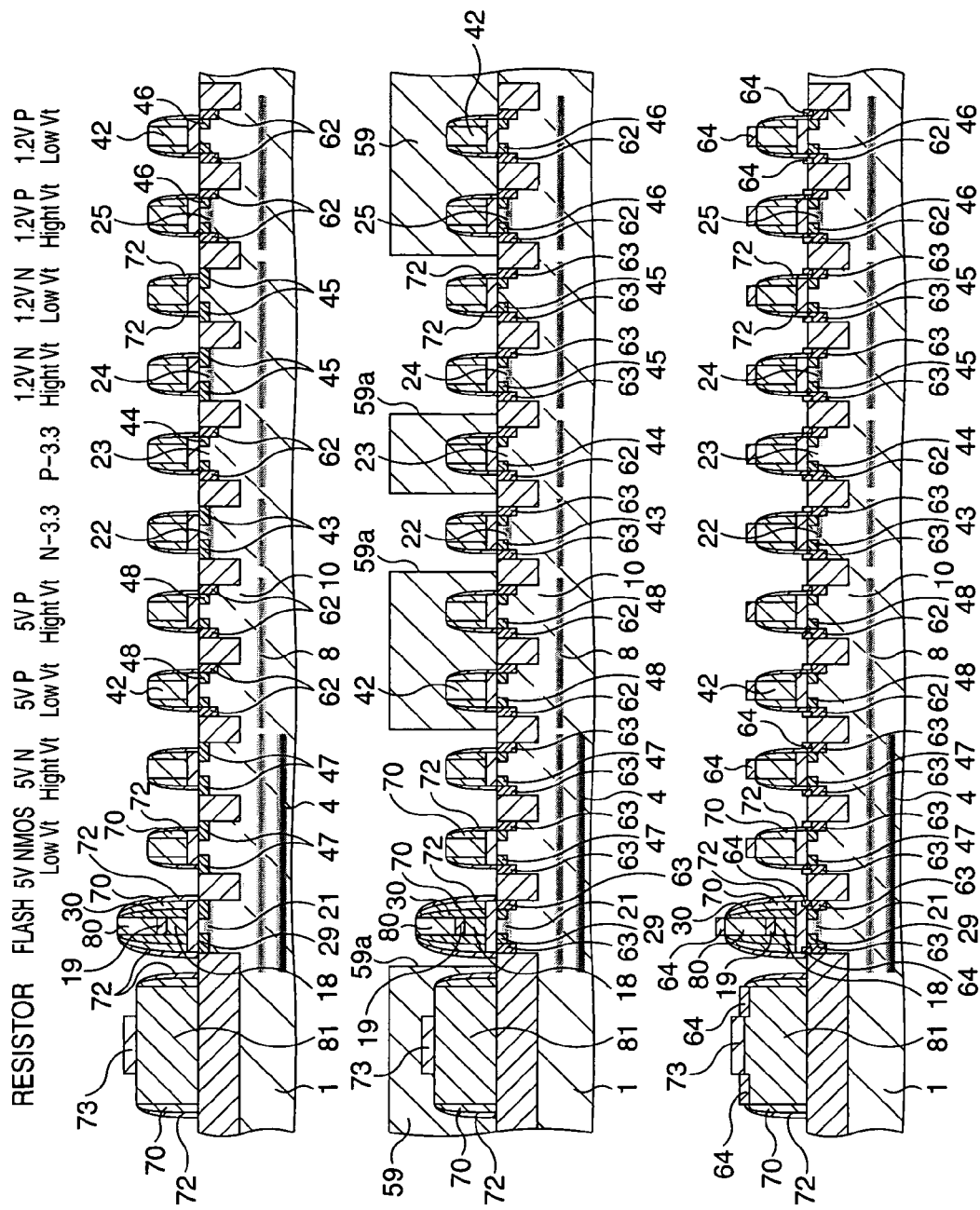
FIG. 17A, FIG. 17B, and FIG. 17C are schematic sectional views showing the manufacturing method of the semiconductor device according to the modification example of the first embodiment in process sequence following to FIG. 16C.

As shown in FIG. 17A, the resist pattern 58 is used as the mask, and the whole surface of the silicon oxide film 71 is dry etched. At this time, the resist pattern 58 works as the mask and the silicon oxide film 71 is left at the center portion on the resistance element 81, and thereby, a silicide block layer 73 is pattern formed. At the same time, the silicon oxide film 71 is etched back, side wall spacers 72 are formed so as to cover the both side surfaces of the resistance element 81, and to respectively cover the side wall spacers 70 at the respective active regions of the flash memory, 5VN·LowVt, 5VN·HighVt, 5VP·LowVt, 5VP·HighVt, N-3.3, P-3.3, 1.2VN·HighVt, 1.2VN·LowVt, 1.2VP·HighVt, and 1.2VP·LowVt.

Subsequently, the source/drain regions are formed at the respective regions of the flash memory, 5VN·LowVt, 5VN·HighVt, N-3.3, 1.2VN·HighVt, and 1.2VN·LowVt.

As shown in FIG. 17B, the resist is coated on the silicon substrate 1, the corresponding resist is processed by the lithography, and openings 59a including the respective active regions of the flash memory, 5VN·LowVt, 5VN·HighVt, N-3.3, 1.2VN·HighVt, and 1.2VN·LowVt are formed to form a resist pattern 59. Next, this resist pattern 59 is used as the mask, and an N-type impurity, here phosphorus ($P^+$) is ion implanted into the respective active regions of the flash memory, 5VN·Lowvt, 5VN·HighVt, N-3.3, 1.2VN·Highvt, and 1.2VN·LowVt, with the condition of the acceleration energy of 10 keV, the dose amount of $6 \times 10^{15}/cm^2$ to form source/drain regions 63 matching to positions of the respective side wall spacers 72 at the respective active regions. At this time phosphorus ($P^+$) is ion implanted into a control gate electrode 80 of the flash memory, and the gate electrodes 42 at the respective active regions of 5VN·LowVt, 5VN·HighVt, N-3.3, 1.2VN·HighVt, and 1.2VN·LowVt at the same time, and the control gate electrode 80 and the respective gate electrodes 42 become to be the N-type. At this time, the respective transistors (memory cell at the active region of the flash memory) are formed at the respective active regions of the flash memory, 5VN·LowVt, 5VN·HighVt, N-3.3, 1.2VN·HighVt, and 1.2VN·LowVt. The resist pattern 59 is then removed by the ashing treatment, and so on.

After that, an anneal treatment is performed to the silicon substrate 1. Here, a rapid anneal treatment (RTA) is performed, for example, at 1025° C., under a nitride ($N_2$) atmosphere, for three seconds. Herewith, the respective impurities ion implanted at the above-stated respective processes such as boron ($B^+$) in the resistance element 81 and boron ($B^+$), phosphorus ($P^+$), in the source/drain regions 62 and 63, are activated.

Subsequently, the resistance element is silicided, and the respective transistors are salicided.

As shown in FIG. 17C, a silicide metal, here a Co film is accumulated on the whole surface of the silicon substrate 1 to be the film thickness of approximately 8 nm, and thereafter, a heat treatment is performed. By this heat treatment, silicide layers 64 in which the Co and the silicon are silicided, are respectively formed at the both sides of the silicide block layer 73 at the upper surface of the resistance element 81, and on the gate electrodes 42 and on the source/drain regions 62 and 63 at the respective transistors. After that, unreacted Co films are removed by a wet etching.

Subsequently, the semiconductor device is completed by passing through formations of interlayer insulation films, plugs for connection, wirings, and so on.

Figure 18:
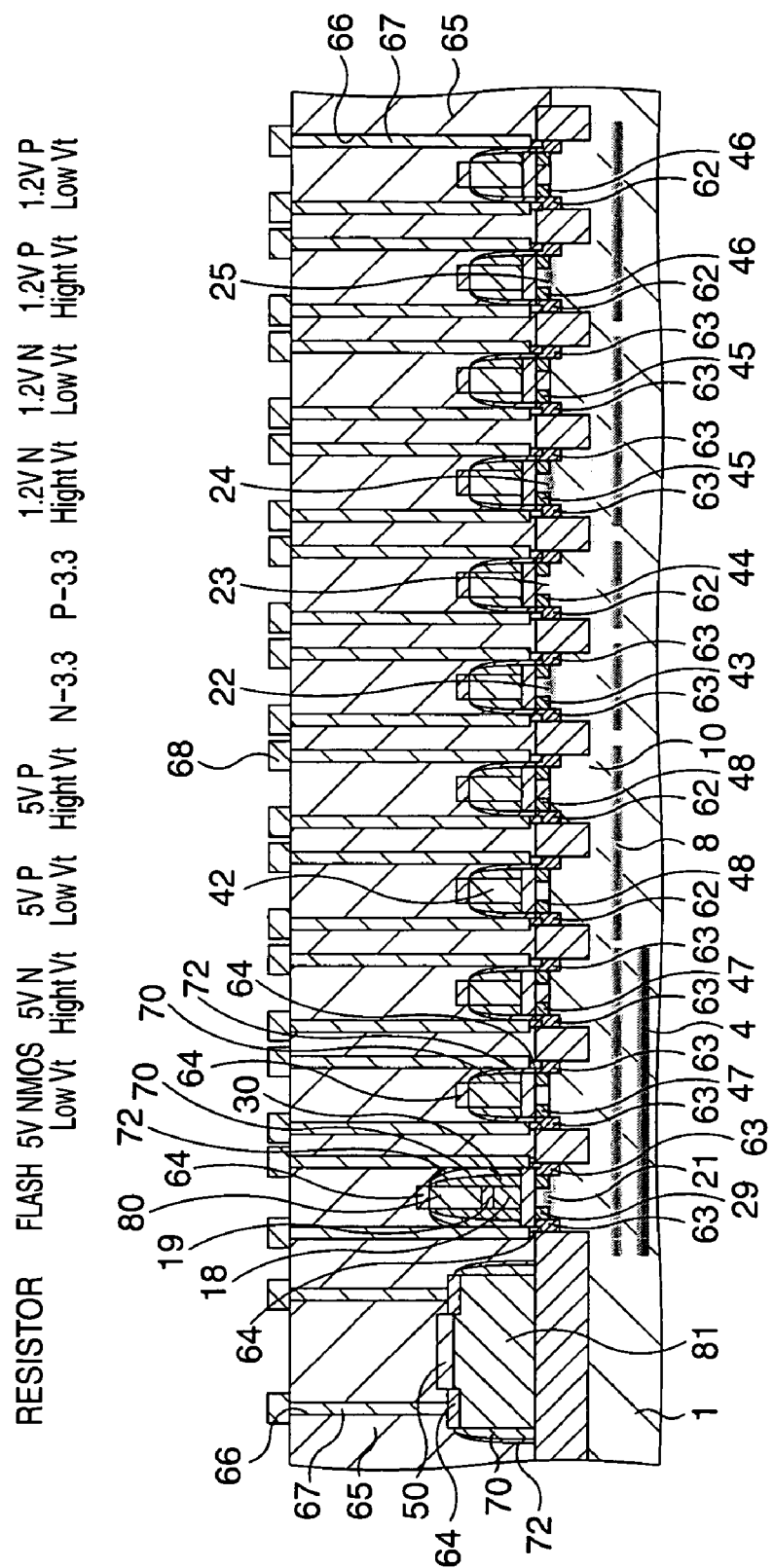
FIG. 18 is a schematic sectional view showing the manufacturing method of the semiconductor device according to the modification example of the first embodiment in process sequence following to FIG. 17C.

As shown in FIG. 18, a silicon oxide film is accumulated on the whole surface of the silicon substrate 1 to be the film thickness of approximately 600 nm, so as to cover the resistance element 81 and the respective transistors by, for example, a high density plasma (HDP)-CVD method, to form an interlayer insulation film 65. Next, respective contact holes 66 are formed on the interlayer insulation film 65. The respective contact holes 66 are respectively formed so that parts of the surfaces of the silicide layers 64 at the both sides of the silicide block layer 73 are to be exposed as for the resistance element 81, and so that parts of the surfaces of the silicide layers 64 on the source/drain regions 62 and 63 are to be exposed as for the respective transistors.

Next, base films (not shown) such as a Ti or a TiN are formed so as to cover inside walls of the respective contact holes 66, and thereafter, for example, a tungsten (W) film is formed on the interlayer insulation film 65 so as to embed the respective contact holes 66 via the base films, and W plugs 67 are formed by smoothing the surface of the W film while using the interlayer insulation film 65 as a stopper by, for example, a CMP method (Chemical Mechanical Polishing).

Here, at the upper surface of the resistance element 81, the resistance element 81 and the W plugs 67 are connected via the silicide layers 64, and the resistance value (connection resistive component) of this connecting portion can be reduced. In the present modification example, the impurity is ion implanted into the resistor 41 pattern formed from the polycrystalline silicon film 40, to form the resistance element 81, and just after the resist pattern 57 being the mask for the ion implantation is removed, the silicon oxide film 71 to be the silicide block layer 73 is formed so as to cover the resistance element 81, and therefore, the resistance value of the resistance element 81 main body is stably defined to the desired value. Consequently, in the present modification example, it is possible to stably control the resistance values of the connection resistive component and the resistance element 81 as a whole.

Next, a metallic film, for example, an aluminum (Al) film is accumulated on the surface of the interlayer insulation film 65 by, for example, a spattering method, this Al film is processed into a wiring shape on the respective W plugs 67 by the lithography and the dry etching, and respective wirings 68 which are electrically connected to the various connecting portions via the W plugs 67 are pattern formed.

The semiconductor device is thereafter completed by passing through the formation of the further interlayer insulation films, the plugs for connection, the wirings, and so on.

As described above, according to the present modification example, as for the resistance value of the resistance element 81, the resistance values of not only the connection resistive component but also the resistance element 81 main body can be stably controlled easily and precisely without increasing the number of processes, and the semiconductor device including the resistance element 81 with high reliability can be realized. Besides, in this case, the number of processes can be reduced by forming the resistor 41 and the gate electrodes 42 of the respective transistors at the same time, while realizing the above-stated stable control of the resistance value, and further, by performing the ion implantation into the resistor 41 and the ion implantation to form the respective source/drain regions 62 at the same time.

Second Embodiment

A semiconductor device manufactured by the present invention is different from the one in the first embodiment, and it is an example in which a flash memory is not mixedly mounted, namely, it is configured by integrating a resistance element, middle voltage transistors composing an input/output circuit component, and low voltage transistors composing a logic circuit component. Here, as respective transistors, an N-channel middle voltage (3.3 V) (3.3VN), a P-channel middle voltage (3.3 V) (3.3VP), an N-channel low voltage (1.2 V)·high threshold transistor (1.2VN·HighVt), an N-channel low voltage (1.2 V)·low threshold transistor (1.2VN·LowVt) a P-channel low voltage (1.2 V)·high threshold transistor (1.2VP·HighVt), and a P-channel low voltage (1.2 V)·low threshold transistor (1.2VP·LowVt).

FIG. 19A to FIG. 25C are schematic sectional views showing a manufacturing method of the semiconductor device in process sequence according to a second embodiment. In the respective views, a resistance element and six varieties of transistors (3.3VN, 3.3VP, 1.2VN·HighVt, 1.2VN·LowVt, 1.2VP·HighVt, and 1.2VP·LowVt) are formed from left side in sequence. Here, at upper portions of the respective views, a forming region of the resistance element and active regions of the respective transistors are shown.

At first, element isolation structures are formed to define the forming region of the resistance element and the active regions of the respective transistors.

As shown in FIG. 19A, respective first STI regions 102 and a second STI region 103 as the element isolation structures are formed at an element isolation region of a silicon substrate 101, by using, for example, an STI method at a surface layer of the silicon substrate 101. A field oxide film as the element isolation structure may be formed by a so-called LOCOS method instead of the STI. The respective active regions of the six varieties of transistors are defined by the respective first STI regions 102, and the forming region of the resistance element is defined by the second STI region 103. Next, surfaces of the respective active regions are oxidized to form a thin silicon oxide film (not shown) with a film thickness of approximately 10 nm.

Subsequently, an impurity is doped into the respective active regions of 3.3VN, 1.2VN·HighVt, and 1.2VN·LowVt.

As shown in FIG. 19B, a resist is coated on the silicon substrate 101, the corresponding resist is processed by a lithography, and respective openings 111a respectively including the active region of 3.3VN, the respective active regions of 1.2VN·HighVt, and 1.2VN·LowVt are formed to form a resist pattern 111. Next, this resist pattern 111 is used as a mask, and a P-type impurity to form a P-type well, here boron (B$^+$) is ion implanted into the respective active regions of 3.3VN, 1.2VN·HighVt, and 1.2VN·LowVt, with a condition of an acceleration energy of 420 keV, a dose amount of $1.4 \times 10^{13}/cm^2$. The implanted impurities are denoted by doped impurities 103. Further, the resist pattern 111 is used as the mask, and the P-type impurity to form a channel stop region, here boron (B$^+$) is ion implanted into the respective active regions of 3.3VN, 1.2VN·HighVt, and 1.2VN·LowVt, with the condition of the acceleration energy of 100 keV, the dose amount of $8 \times 10^{12}/cm^2$. The implanted impurities are denoted by doped impurities 104. The resist pattern 111 is then removed by an ashing treatment, and so on.

Subsequently, the impurity is doped into the respective active regions of 3.3VP, 1.2VP·HighVt, and 1.2VP·LowVt.

As shown in FIG. 19C, the resist is coated on the silicon substrate 101, the corresponding resist is processed by the lithography, and respective openings 112a including the active region of 3.3VP, and the respective active regions of 1.2VP·HighVt and 1.2VP·LowVt are formed to form a resist pattern 112. Next, this resist pattern 112 is used as the mask, and an N-type impurity to form an N-type well, here phosphorus (P$^+$) is ion implanted into the respective active regions of 3.3VP, 1.2VP·HighVt, and 1.2VP·LowVt, with the condition of the acceleration energy of 600 keV, the dose amount of $1.5 \times 10^{13}/cm^2$. The implanted impurities are denoted by doped impurities 105. Further, this resist pattern 112 is used as the mask, and the N-type impurity to form the channel stop region, here phosphorus (P$^+$) is ion implanted into the respective active regions of 3.3VP, 1.2VP·HighVt, and 1.2VP·LowVt, with the condition of the acceleration energy of 240 keV, the dose amount of $8 \times 10^{12}/cm^2$. The implanted impurities are denoted by doped impurities 106. The resist pattern 112 is then removed by the ashing treatment, and so on.

Subsequently, the impurity is doped into the active region of 1.2VN·HighVt.

As shown in FIG. 19D, the resist is coated on the silicon substrate 101, the corresponding resist is processed by the lithography, and an opening 113a including the active region of 1.2VN·HighVt is formed to form a resist pattern 113. Next, this resist pattern 113 is used as the mask, and the P-type impurity, here boron (B$^+$) is ion implanted into the active region of 1.2VN·HighVt, with the condition of the acceleration energy of 15 keV, the dose amount of $7\times10^{12}$/cm$^2$. The implanted impurity is denoted by a doped impurity 107. The resist pattern 113 is then removed by the ashing treatment, and so on.

Subsequently, the impurity is doped into the active region of 1.2VP·HighVt.

As shown in FIG. 20A, the resist is coated on the silicon substrate 101, the corresponding resist is processed by the lithography, and an opening 114a including the active region of 1.2VP·HighVt is formed to form a resist pattern 114. Next, this resist pattern 114 is used as the mask, and the N-type impurity, here arsenic (As$^+$) is ion implanted into the active region of 1.2VP·HighVt, with the condition of the acceleration energy of 150 keV, the dose amount of $6\times10^{12}$/cm$^2$. The implanted impurity is denoted by a doped impurity 108. The resist pattern 114 is then removed by the ashing treatment, and so on.

Subsequently, the impurity is doped into the active region of 3.3VN.

As shown in FIG. 20B, the resist is coated on the silicon substrate 101, the corresponding resist is processed by the lithography, and an opening 115a including the active region of 3.3VN is formed to form a resist pattern 115. Next, this resist pattern 115 is used as the mask, and the P-type impurity, here boron (B$^+$) is ion implanted into the active region of 3.3VN, with the condition of the acceleration energy of 35 keV, the dose amount of $4.5\times10^{12}$/cm$^2$. The implanted impurity is denoted by a doped impurity 109. The resist pattern 115 is then removed by the ashing treatment, and so on.

Subsequently, the impurity is doped into the active region of 3.3VP.

As shown in FIG. 20C, the resist is coated on the silicon substrate 101, the corresponding resist is processed by the lithography, and an opening 116a including the active region of 3.3VP is formed to form a resist pattern 116. Next, this resist pattern 116 is used as the mask, and the N-type impurity, here arsenic (As$^+$) is ion implanted into the active region of 3.3VP, with the condition of the acceleration energy of 150 keV, the dose amount of $2\times10^{12}$/cm$^2$. The implanted impurity is denoted by a doped impurity 110. The resist pattern 116 is then removed by the ashing treatment, and so on.

Subsequently, an SiO film is formed at the respective active regions of 3.3VN and 3.3VP.

As shown in FIG. 20D, an SiO film 121 is formed at the respective active regions to be the film thickness of approximately 6 nm by a thermal oxidation method. Next, the resist is coated on the SiO film 121, the corresponding resist is processed by the lithography, and a resist pattern 117 in a shape including the respective active regions of 3.3VN and 3.3VP is formed on the SiO film 121. The resist pattern 117 is then used as the mask, the SiO film 121 is etched, and the SiO film 121 is left only at the respective active regions of 3.3VN and 3.3VP. The resist pattern 117 is then removed by the ashing treatment, and so on.

Subsequently, the SiO film is formed at the respective active regions of 1.2VN·HighVt, 1.2VN·LowVt, 1.2VP·HighVt, and 1.2VP·LowVt.

Figures 21A, 21B, 21C:
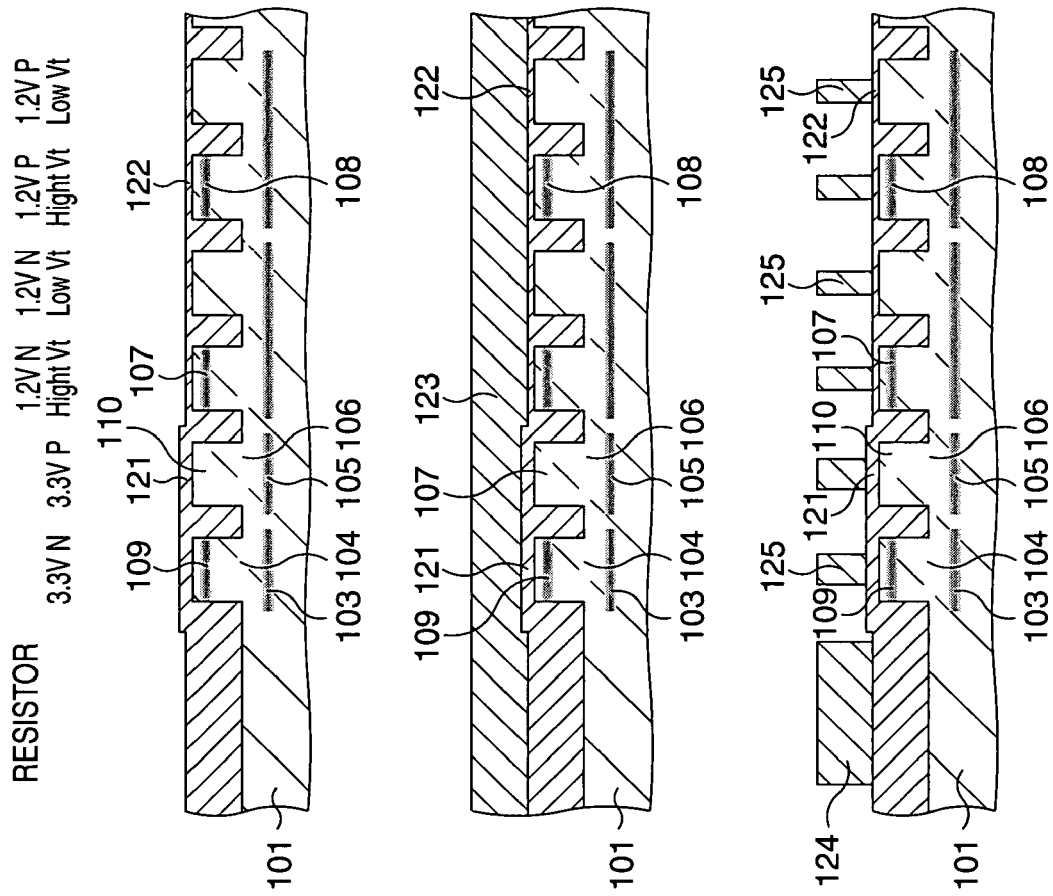
FIG. 21A, FIG. 21B, and FIG. 21C are schematic sectional views showing the manufacturing method of the semiconductor device according to the second embodiment in process sequence following to FIG. 20D.

As shown in FIG. 21A, the surface of the silicon substrate 101 is thermal oxidized. At this time, an SiO film 122 with the film thickness of approximately 2.2 nm is formed at the respective active regions of 1.2VN·HighVt, 1.2VN·LowVt, 1.2VP·HighVt, and 1.2VP·LowVt of which surfaces are exposed within the respective active regions. At the same time, the film thickness of the SiO film 121 at the respective active regions of 3.3VN and 3.3VP increases. Here, for example, the film thickness of the SiO film 121 at a middle voltage (3.3 V) operation region becomes to be approximately 7 nm, the film thickness of the SiO film 122 at a low voltage (1.2 V) operation region becomes to be approximately 2.2 nm, and both function as gate insulation films at the respective regions.

Subsequently, a polycrystalline silicon film is formed.

As shown in FIG. 21B, a polycrystalline silicon film 123 is accumulated on the whole surface of the silicon substrate 101 to be the film thickness of approximately 180 nm by a CVD method, and thereafter, a silicon nitride film (not shown) is accumulated to be the film thickness of approximately 30 nm as an antireflection material and as an etching mask material.

Subsequently, a resistor and gate electrodes at the respective active regions are pattern formed.

As shown in FIG. 21C, the polycrystalline silicon film 123 is processed by the lithography and a dry etching, and a resistor 124 at the forming region of the resistor, gate electrodes 125 at the respective active regions, are respectively pattern formed. The resist pattern (not shown) used as the mask is then removed by the ashing treatment, and so on.

Subsequently, LDD regions are formed at the active region of 3.3VN.

Figures 22A, 22B, 22C:
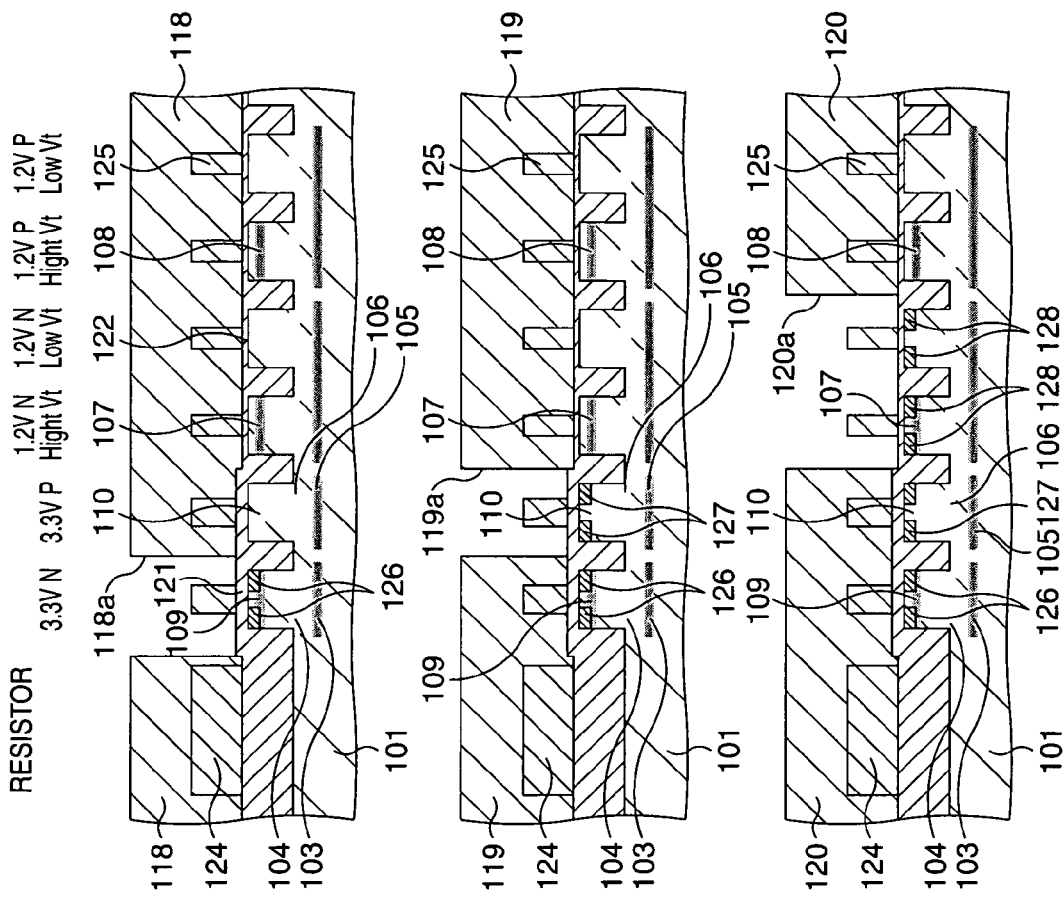
FIG. 22A, FIG. 22B, and FIG. 22C are schematic sectional views showing the manufacturing method of the semiconductor device according to the second embodiment in process sequence following to FIG. 21C.

As shown in FIG. 22A, the resist is coated on the silicon substrate 101, the corresponding resist is processed by the lithography, and an opening 118a exposing the active region of 3.3VN is formed to form a resist pattern 118. Next, this resist pattern 118 and the gate electrode 125 at the active region of 3.3VN are used as the masks, and the N-type impurity, here phosphorus (P$^+$) is ion implanted into both sides of the gate electrode 125 at the active region of 3.3VN via the SiO film 121, with the condition of the acceleration energy of 35 keV, the dose amount of $4\times10^{13}$/cm$^2$, to form LDD regions 126. The resist patten 118 is then removed by the ashing treatment, and so on.

Subsequently, the LDD regions are formed at the active region of 3.3VP.

As shown in FIG. 22B, the resist is coated on the silicon substrate 101, the corresponding resist is processed by the lithography, and an opening 119a exposing the active region of 3.3VP is formed to form a resist pattern 119. Next, this resist pattern 119 and the gate electrode 125 at the active region of 3.3VP are used as the masks, and the P-type impurity, here BF$_2^+$ is ion implanted into the both sides of the gate electrode 125 at the active region of 3.3VP via the SiO film 121, with the condition of the acceleration energy of 10 keV, the dose amount of $4\times10^{13}$/cm$^2$, to form LDD regions 127. The resist patten 119 is then removed by the ashing treatment, and so on.

Subsequently, the LDD regions are formed at the respective active regions of 1.2VN·HighVt and 1.2VN·LowVt.

As shown in FIG. 22C, the resist is coated on the silicon substrate 101, the corresponding resist is processed by the lithography, and an opening 120a including the respective active regions of 1.2VN·HighVt and 1.2VN·LowVt is formed to form a resist pattern 120. Next, this resist pattern 120 and the gate electrodes 125 at the respective active regions of 1.2VN·HighVt and 1.2VN·LowVt are respectively used as the masks, and the N-type impurity, here arsenic (As$^+$) is ion implanted into the both sides of the gate electrodes 125 at the respective active regions of 1.2VN·HighVt and 1.2VN·LowVt via the SiO film 122, with the condition of the acceleration energy of 3 keV, the dose amount of $1.2 \times 10^{15}/cm^2$, and further, the P-type impurity, here $BF_2^+$ is ion implanted from four directions, for example, inclined at 28° from a normal line relative to the silicon substrate 101, with the condition of the acceleration energy of 80 keV, the dose amount of $6 \times 10^{12}/cm$, to form LDD regions 128. The resist pattern 120 is then removed by the ashing treatment, and so on.

Subsequently, the LDD regions are formed at the respective active regions of 1.2VP·HighVt and 1.2VP·LowVt.

Figures 23A, 23B, 23C:
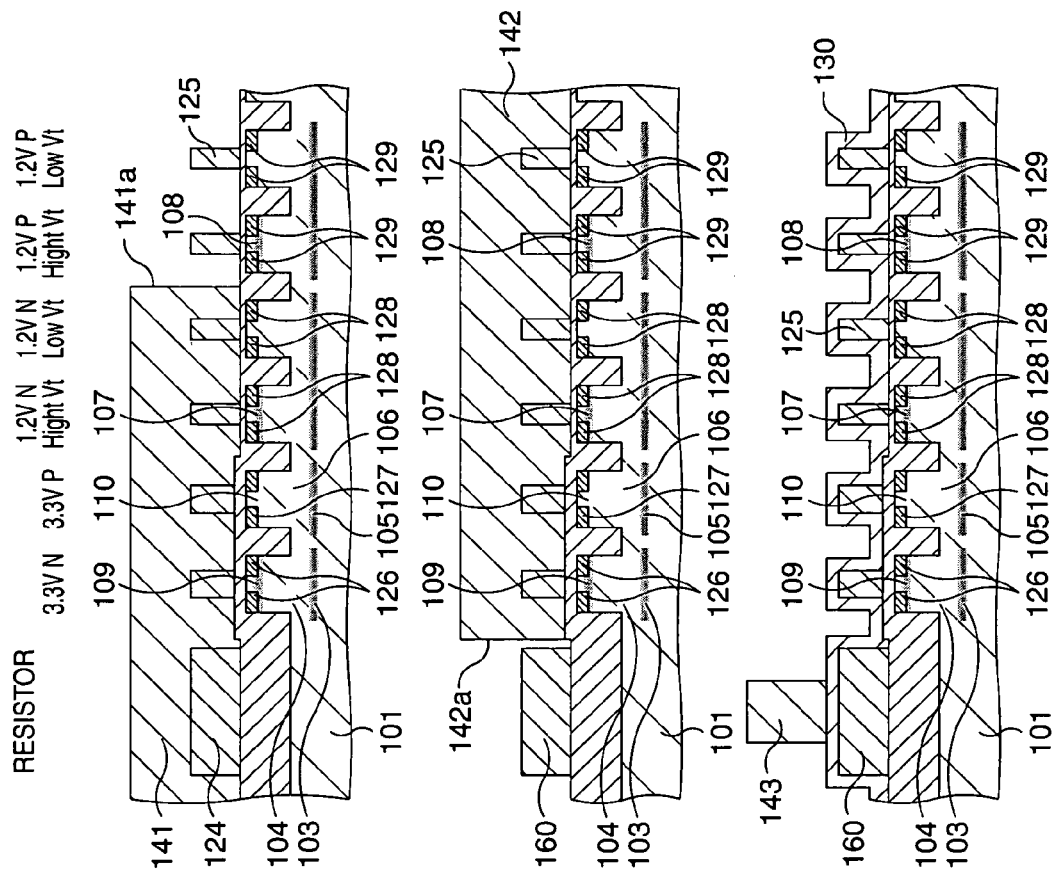
FIG. 23A, FIG. 23B, and FIG. 23C are schematic sectional views showing the manufacturing method of the semiconductor device according to the second embodiment in process sequence following to FIG. 22C.

As shown in FIG. 23A, the resist is coated on the silicon substrate 101, the corresponding resist is processed by the lithography, and an opening 141a including the respective active regions of 1.2VP·Highvt and 1.2VP·LowVt is formed to form a resist pattern 141. Next, this resist pattern 141 and the gate electrodes 125 at the respective active regions of 1.2VP·HighVt and 1.2VP·LowVt are used as the masks, and the P-type impurity, here boron (B+) is ion implanted into the both sides of the gate electrodes 125 at the respective active regions of 1.2VP·HighVt and 1.2VP·LowVt via the SiO film 122, with the condition of the acceleration energy of 0.5 keV, the dose amount of $5.7 \times 10^{14}/cm^2$, and further, the N-type impurity, here arsenic (As+) is ion implanted from the four directions, for example, inclined at 28° from the normal line relative to the silicon substrate 101, with the condition of the acceleration energy of 120 keV, the dose amount of $7 \times 10^{12}/cm$, to form LDD regions 129. The resist pattern 141 is then removed by the ashing treatment, and so on.

Subsequently, the impurity is doped into the resistor 124 to form a resistance element 160.

As shown in FIG. 23B, the resist is coated on the silicon substrate 101, the corresponding resist is processed by the lithography, and an opening 142a exposing only the resistor 124 is formed to form a resist pattern 142. Next, this resist pattern 142 is used as the mask, and the impurity, here boron (B+) being the P-type impurity is ion implanted into the resistor 124, with the condition of the acceleration energy of 8 keV, the dose amount of $2 \times 10^{15}/cm^2$, to form the resistance element 160. The resist pattern 142 is then removed by the ashing treatment, and so on.

Subsequently, a silicon oxide film is formed on a whole surface including a surface of the resistance element 160.

As shown in FIG. 23C, just after the resist pattern 142 is removed, a silicon oxide film 130 as an insulating film is accumulated to be the film thickness of approximately 130 nm so as to cover the whole surface of the silicon substrate 101 including the surface of the resistance element 160 by, for example, a thermal CVD method. Next, the resist is coated on the silicon oxide film 130, the corresponding resist is processed by the lithography, to form a resist pattern 143 having a shape covering a part corresponding to an upper portion of the resistance element 160 on the silicon oxide film 130, here, the shape to cover only a center portion of the resistance element 160.

Subsequently, a silicide block layer and side wall spacers are formed at the same time.

Figure 24A:
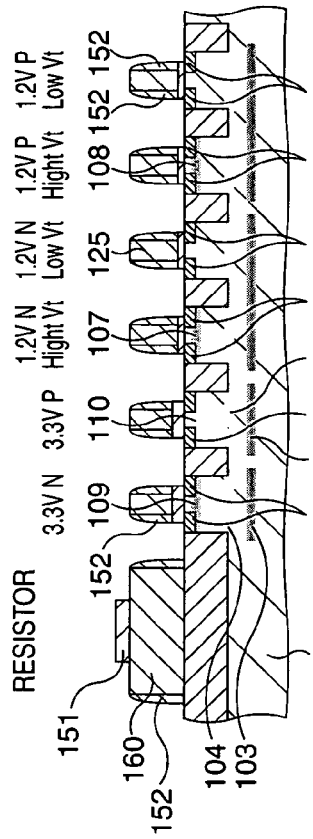
FIG. 24A, FIG. 24B, and FIG. 24C are schematic sectional views showing the manufacturing method of the semiconductor device according to the second embodiment in process sequence following to FIG. 23C.

As shown in FIG. 24A, the resist pattern 143 is used as the mask, and the whole surface of the silicon oxide film 130 is dry etched. At this time, the resist pattern 143 is working as the mask to leave the silicon oxide film 130 at the center portion on the resistance element 160, and a silicide block layer 151 is pattern formed. At the same time, the silicon oxide film 130 is etched back, side wall spacers 152 are formed so as to cover the both side surfaces of the resistance element 160, to cover the the both side surfaces of the gate electrodes 125 at the respective active regions of 3.3VN, 3.3VP, 1.2VN·HighVt, 1.2VN·LowVt, 1.2VP·HighVt, and 1.2VP·LowVt.

Subsequently, source/drain regions are formed at the respective active regions of 3.3VP, 1.2VP·HighVt, and 1.2VP·LowVt.

Figure 24B:
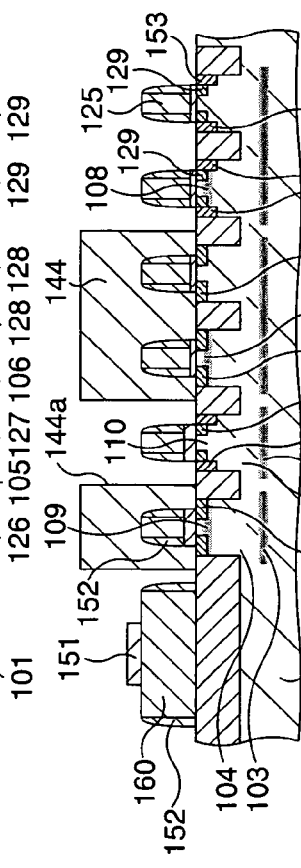

As shown in FIG. 24B, the resist is coated on the silicon substrate 101, the corresponding resist is processed by the lithography, and openings 144a including the respective active regions of 3.3VP, 1.2VP·HighVt, and 1.2VP·LowVt are formed to form a resist pattern 144. Next, the resist pattern 144 is used as the mask, and the P-type impurity, here boron (B+) is ion implanted into the respective active regions of 3.3VP, 1.2VP·HighVt, and 1.2VP·LowVt, with the condition of the acceleration energy of 5 keV, the dose amount of $4 \times 10^{15}/cm^2$, to form source/drain regions 153 matching to positions of the respective side wall spacers 152 at the respective active regions. At this time, boron (B+) is ion implanted into the gate electrodes 125 at the respective active regions of 3.3VP, 1.2VP·HighVt, and 1.2VP·LowVt at the same time, and the corresponding respective gate electrodes 125 become to be P-type. At this time, respective transistors are formed at the respective active regions of 3.3VP, 1.2VP·HighVt, and 1.2VP·LowVt. The resist pattern 144 is then removed by the ashing treatment, and so on.

Subsequently, the source/drain regions are formed at the respective active regions of 3.3VN, 1.2VN·HighVt, and 1.2VN·LowVt.

Figure 24C:
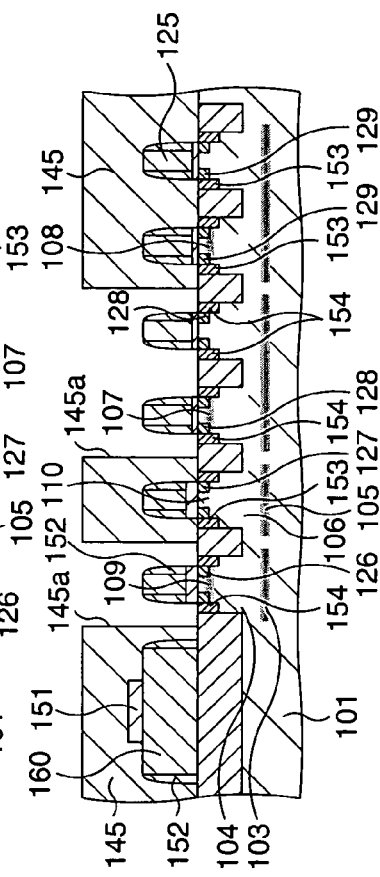

As shown in FIG. 24C, the resist is coated on the silicon substrate 101, the corresponding resist is processed by the lithography, and openings 145a including the respective active regions of 3.3VN, 1.2VN·HighVt, and 1.2VN·LowVt are formed to form a resist pattern 145. Next, the resist pattern 145 is used as the mask, and the N-type impurity, here phosphorus (P+) is ion implanted into the respective active regions of 3.3VN, 1.2VN·HighVt, and 1.2VN·LowVt, with the condition of the acceleration energy of 10 keV, the dose amount of $6 \times 10^{15}/cm^2$, to form source/drain regions 154 matching to positions of the respective side wall spacers 152 at the respective active regions. At this time, phosphorus (P+) is ion implanted into the gate electrodes 125 at the respective active regions of 3.3VN, 1.2VN·HighVt, and 1.2VN·LowVt at the same time, and the corresponding respective gate electrodes 125 become to be N-type. At this time, respective transistors are formed at the respective active regions of 3.3VN, 1.2VN·HighVt, and 1.2VN·LowVt. The resist pattern 145 is then removed by the ashing treatment, and so on.

Subsequently, an anneal treatment is performed to the silicon substrate 101.

Figures 25A, 25B, 25C:
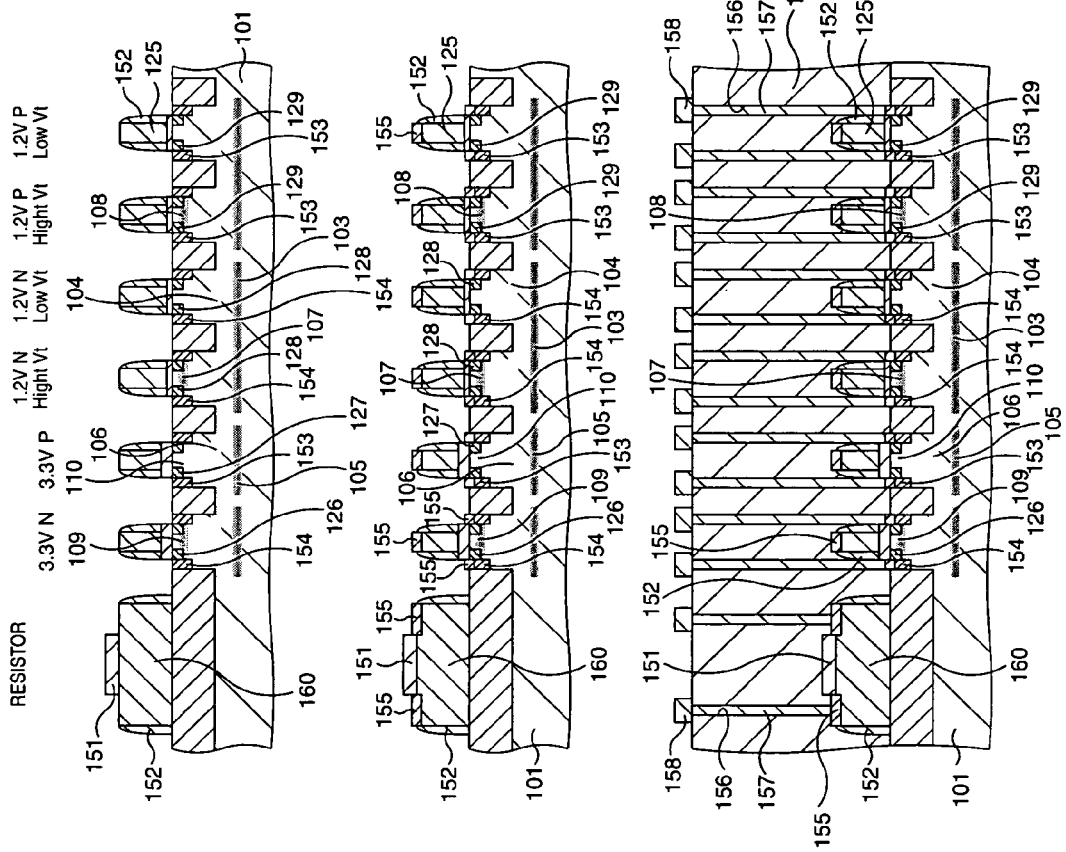
FIG. 25A, FIG. 25B, and FIG. 25C are schematic sectional views showing the manufacturing method of the semiconductor device according to the second embodiment in process sequence following to FIG. 24C.

As shown in FIG. 25A, a rapid anneal treatment (RTA) is performed, for example, at 1025° C., under a nitride ($N_2$) atmosphere, for three seconds. Herewith, the respective impurities ion implanted at the above-stated respective processes such as boron (B+) in the resistance element 160 and boron (B+), phosphorus (P+), in the source/drain regions 153 and 154, are activated.

Subsequently, the resistance element is silicided, and the respective transistors are salicided.

As shown in FIG. 25B, a silicide metal, here a Co film is accumulated on the whole surface of the silicon substrate 101 to be the film thickness of approximately 8 nm, and thereafter, a heat treatment is performed. By this heat treatment, silicide layers 155 in which the Co and the silicon are silicided, are respectively formed at the both sides of the silicide block layer 151 at the upper surface of the resistance element 160, and on the gate electrodes 125 and on the source/drain regions 153 and 154 at the respective transistors. After that, unreacted Co films are removed by a wet etching.

Subsequently, the semiconductor device is completed by passing through formations of interlayer insulation films, plugs for connection, wirings, and so on.

As shown in FIG. 25C, a silicon oxide film is accumulated on the whole surface of the silicon substrate 101 to be the film thickness of approximately 600 nm, so as to cover the resistance element 160 and the respective transistors by, for example, a high density plasma (HDP)-CVD method, to form an interlayer insulation film 159. Next, respective contact holes 156 are formed at the interlayer insulation film 159. The respective contact holes 156 are respectively formed so that parts of the surfaces of the silicide layers 155 at the both sides of the silicide block layer 151, are to be exposed as for the resistance element 160, and so that parts of the surfaces of the silicide layers 155 on the source/drain regions 153 and 154 are to be exposed as for the respective transistors.

Next, base films (not shown) such as a Ti or a TiN are formed so as to cover inside walls of the respective contact holes 156, and thereafter, for example, a tungsten (W) film is formed on the interlayer insulation film 159 so as to embed the respective contact holes 156 via the base films, and W plugs 157 are formed by smoothing the surface of the W film while using the interlayer insulation film 159 as a stopper by, for example, a CMP method (Chemical Mechanical Polishing).

Here, at the upper surface of the resistance element 160, the resistance element 160 and the W plugs 157 are connected via the silicide layers 155, and the resistance value of this connecting portion (connection resistive component) can be reduced. In the present embodiment, the impurity is ion implanted into the resistor 124 pattern formed from the polycrystalline silicon film 123, to form the resistance element 160, and just after the resist pattern 142 being the mask for the ion implantation is removed, the silicon oxide film 130 to be the silicide block layer 151 is formed so as to cover the resistance element 160, and therefore, the resistance value of the resistance element 160 main body is stably defined to the desired value. Consequently, in the present embodiment, it is possible to stably control the resistance values of the connection resistive component and the resistance element 160 as a whole.

Next, a metallic film, for example, an aluminum (Al) film is accumulated on the surface of the interlayer insulation film 159 by, for example, a spattering method, this Al film is processed into wiring shapes on the respective W plugs 157 by the lithography and the dry etching, and respective wirings 158 which are electrically connected to the various connecting portions via the W plugs 157 are pattern formed.

The semiconductor device is thereafter completed by passing through the formation of the further interlayer insulation films, the plugs for connection, the wirings, and so on.

As described above, according to the present embodiment, as for the resistance value of the resistance element 160, the resistance values of not only the connection resistive component but also the resistance element 160 main body can be stably controlled easily and precisely without increasing the number of processes, and the semiconductor device including the resistance element 160 with high reliability can be realized. Besides, in this case, the increase in the number of processes can be suppressed as much as possible because the resistor 124 and the gate electrodes 125 of the respective transistors are formed at the same time, while realizing the above-stated stable control of the resistance value.

According to the present invention, as for a resistance value of a resistance element, the resistance values of not only a connection resistive component but also the resistance element main body can be stably controlled easily and precisely without increasing the number of processes, and a semiconductor device including the resistance element with high reliability can be realized.

Further, according to the present invention, the increase in the number of processes can be suppressed as much as possible because a resistor and gate electrodes of transistors are formed at the same time, while realizing the above-stated stable control of the resistance value.

The present embodiments are to be considered in all respects as illustrative and no restrictive, and all changes which come within the meaning and range of equivalency of the claims are therefore intended to be embraced therein. The invention may be embodied in other specific forms without departing from the spirit of essential characteristics thereof.

What is claimed is:

1. A manufacturing method of a semiconductor device in which a first and a second element isolation structures are formed on a semiconductor substrate, and transistors are included at active regions defined by the first element isolation structure, and a resistance element is included on the second element isolation structure, comprising the steps of:

forming a semiconductor film on the semiconductor substrate including on the second element isolation structure, and processing the semiconductor film so that the semiconductor film is respectively left on the second element isolation structure and on the active regions to form a resistor and gate electrodes;

forming a first mask exposing the active regions, doping a first impurity into both sides of the gate electrodes at the active regions, and thereafter, removing the first mask;

forming a second mask exposing the resistor, doping a second impurity into the resistor, and thereafter, removing the second mask;

forming an insulating film on a whole surface including the resistor and the gate electrodes, just after the second mask is removed; and processing the insulating film to leave the insulating film so as to cover a part of an upper surface of the resistor, and to cover side surfaces of the gate electrodes.

2. The manufacturing method of the semiconductor device according to claim 1, further comprising the step of;

activating the first impurity doped into the active regions and the second impurity doped into the resistor by a thermal treatment, after the step processing the insulating film.

3. The manufacturing method of the semiconductor device according to claim 1, wherein the second impurity is doped into the active regions as well as the resistor in the step doping the second impurity.

4. The manufacturing method of the semiconductor device according to claim 1, further comprising the step of:

forming a silicide layer on an exposing portion at the upper surface of the resistor.

5. A manufacturing method of a semiconductor device in which a first and a second element isolation structures are formed on a semiconductor substrate, and transistors are included at active regions defined by the first element isolation structure, and a resistance element is included on the second element isolation structure, comprising the steps of:

forming a semiconductor film on the semiconductor substrate including on the second element isolation structure, and processing the semiconductor film so that the semiconductor film is left on the second element isolation structure to form a resistor;

forming a mask exposing the resistor, doping an impurity into the resistor by using the mask, and thereafter, removing the mask;

forming an insulating film so as to cover the resistor just after the mask is removed; and processing the insulating film to leave the insulating film in a shape covering a part of an upper surface of the resistor, when the resistance element is formed.

6. The manufacturing method of the semiconductor device according to claim 5, further comprising the step of:

activating the impurity doped into the resistor by a thermal treatment after the step processing the insulating film.

7. The manufacturing method of the semiconductor device according to claim 5, wherein the semiconductor film is processed so that the semiconductor film is left on the active regions as well as on the second element isolation structure to form the resistor and the gate electrodes, in the step processing the semiconductor film.

8. The manufacturing method of the semiconductor device according to claim 5, wherein the insulating film is left so as to cover side surfaces of the gate electrodes as well as the part of the upper surface of the resistor, in the step processing the insulating film.

9. The manufacturing method of the semiconductor device according to claim 5, further comprising the step of:

doping another impurity at both sides of the gate electrodes at the active regions, before the step doping the impurity into the resistor.

10. The manufacturing method of the semiconductor device according to claim 5, further comprising the step of:

forming a silicide layer on an exposing portion at the upper surface of the resistor.

11. The manufacturing method of the semiconductor device according to claim 10, wherein the transistors at the active regions are salicided as well as the silicide layer is formed on the exposing portion at the upper surface of the resistor, in the step forming the silicide layer.

12. The manufacturing method of the semiconductor device according to claim 5, wherein the impurity is doped into the active regions as well as the resistor, in the step doping the impurity into the resistor.

* * * * *